United States Patent
Chan et al.

(10) Patent No.: US 9,171,763 B2
(45) Date of Patent: Oct. 27, 2015

(54) METHODS OF MANUFACTURING A SEMICONDUCTOR DEVICE HAVING VARYING P-TOP AND N-GRADE REGIONS

(71) Applicant: MACRONIX INTERNATIONAL CO., LTD., Hsin-chu (TW)

(72) Inventors: Ching-Lin Chan, Yunlin County (TW); Chen-Yuan Lin, Taitung County (TW); Cheng-Chi Lin, Yilan County (TW); Shih-Chin Lien, Taipei County (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 14/636,931

(22) Filed: Mar. 3, 2015

(65) Prior Publication Data

US 2015/0179527 A1  Jun. 25, 2015

Related U.S. Application Data

(62) Division of application No. 13/724,842, filed on Dec. 21, 2012, now Pat. No. 9,000,519.

(51) Int. Cl.
*H01L 29/66* (2006.01)
*H01L 21/8234* (2006.01)

(52) U.S. Cl.
CPC .. *H01L 21/823493* (2013.01); *H01L 29/66325* (2013.01); *H01L 29/66689* (2013.01)

(58) Field of Classification Search
CPC . H01L 29/785; H01L 29/66795; H01L 29/78; H01L 21/30604; H01L 29/66969
USPC .................. 438/286, 306; 257/343, E21.409, 257/E29.256
See application file for complete search history.

(56) References Cited

U.S. PATENT DOCUMENTS

2011/0140201 A1  6/2011 Lin et al.
2014/0061721 A1* 3/2014 Chan et al. ................. 257/141

OTHER PUBLICATIONS

Office Action for Taiwanese Application No. 102101839 dated Nov. 27, 2014.
Taiwanese Application No. 098143207 filed Dec. 16, 2009 entitled *Lateral Power MOSFET Structure and Method of Manufacture*.

* cited by examiner

*Primary Examiner* — Andy Huynh
(74) *Attorney, Agent, or Firm* — Alston & Bird LLP

(57) ABSTRACT

An improved semiconductor is provided whereby n-grade and the p-top layers are defined by a series of discretely placed n-type and p-type diffusion segments. Also provided are methods for fabricating such a semiconductor.

20 Claims, 36 Drawing Sheets

METHODS OF MANUFACTURING A SEMICONDUCTOR DEVICE HAVING VARYING P-TOP AND N-GRADE REGIONS

CROSS-REFERENCE TO RELATED APPLICATIONS

This application is a divisional of U.S. application Ser. No. 13/724,842, filed Dec. 21, 2012, which is hereby incorporated herein in its entirety by reference.

TECHNOLOGICAL FIELD

Embodiments of the present invention relate generally to a semiconductor device, in particular, a metal oxide semiconductor device, and a method for fabricating such a device.

BACKGROUND

Diffused metal oxide semiconductor (DMOS) devices are characterized by a source region and a backgate region that are diffused at the same time. The transistor channel is formed by the difference in the two diffusions and not a separation implantation, which results in a decreased channel length. The shorter channel allows for low power dissipation and high speed capability.

A lateral diffused metal oxide semiconductor (LDMOS) device has its source and drain at the surface of the wafer causing a lateral current. Two important parameters in the design of LDMOS devices are breakdown voltage and on-state resistance. It is preferred to have a high breakdown voltage and a low on-state resistance to provide a device having relatively lower power consumption when operated under high voltage. Additionally, a low on-state resistance provides a higher drain current when the device is saturated, which tends to improve the operating speed of the device.

FIG. 1 illustrates a plan view of a drift region of a conventional LDMOS device. The LDMOS device 1 of FIG. 1 having a LDMOS region 10 called out by the box as illustrated. The LDMOS device 1 is defined by a source side 20 and a drain side 30.

FIG. 2 illustrates a plan view of the LDMOS region 10 called out in FIG. 1. The LDMOS region 10 having a plurality of p-type diffusion layers or p-top regions 40 substantially continuously extending from the source side 20 to the drain side 30, the plurality of p-top regions 40 disposed in a high voltage n-type well (HVNW). Thus, the conventional LDMOS region 10 is defined by sections of n-type grade or n-grade region 50 disposed on the plurality of p-top regions 40 separated by n-grade region 50 not disposed over any p-top layer.

FIG. 3A is a cross-sectional view of FIG. 2 taken along the AA' section line. This representation of a conventional LDMOS has a p-substrate 60 in which an HVNW 70 has been disposed. A first p-well 80 is formed in the p-substrate 60 while a second p-well 90 is formed in the HVNW 70, the first p-well 80 having a p+ doped region 100 and the second p-well 90 having another p+ doped region 110 adjacent to an n+ doped source region 120. An n+ doped drain region 130 has been formed in the HVNW 70. This section of the LDMOS region 10 is represented by an n-grade region 50 disposed on one of the plurality of p-top regions 40. An etched field oxide isolation region 140 substantially separates the doped regions 100, 110, 120, 130.

Any control gate structure 150 known in the art may be used in the LDMOS device. For example the control gate structure 150 may comprise a conductive layer disposed on a dielectric layer. The control gate structure 150 may additionally comprise dielectric sidewall spacers. An etched interlayer dielectric (ILD) layer 160 is disposed over the defined structure. A first etched metal layer 170 is provided having a network of contacts through the ILD layer 160. The exemplary conventional LDMOS of FIG. 3A additionally shows an inter-metal dielectric (IMD) layer 180 upon which is disposed a second etched metal layer 190 providing a network of contacts through the IMD layer 180.

FIG. 3B is a cross-sectional view of FIG. 2 taken along the BB' section line. This cross-sectional view of the conventional LDMOS has the same structure identified in FIG. 3A except that a p-top layer is not disposed in the HVNW 70.

High voltage LDMOS devices have a variety of uses in semiconductors. For example, LDMOS devices may be used to convert relatively high voltage to relatively low voltage or as switching power transistors that are configured to drive a load. However, the specific on-resistance of the conventional high voltage LDMOS can still be too high as a result of the interaction between the n-grade region and the fully doped p-type region. There remains a need in the art for improved LDMOS devices, in particular, high voltage LDMOS devices having an even lower specific on-resistance.

BRIEF SUMMARY OF EXEMPLARY EMBODIMENTS

Embodiments of the present invention provide semiconductor devices, in particular, metal oxide semiconductor (MOS) devices.

An aspect of the invention comprises a semiconductor, for example, a metal oxide semiconductor (MOS) device comprising a p-substrate; a high voltage n-well (HVNW) disposed in the p-substrate; a first p-well formed in the p-substrate having a first p+ doped region; a second p-well formed in the HVNW having a second p+ doped region adjacent to an n+ doped source region; a discrete n-grade and discrete p-top region formed in the HVNW. The discrete n-grade and p-top region having at least one or more layers, wherein each layer comprises a plurality of p-top segments dispersed among a plurality of n-grade segments.

In an embodiment of the invention, wherein the discrete n-grade and p-top regions comprises two or more layers and the plurality of p-top segments and the plurality of n-grade segments are in a criss-cross arrangement.

According to an embodiment of the invention, the plurality of discrete p-top segments have a depth in the HVNW to define a plurality of depths, a width to define a plurality of widths and a separation distance from a vertically adjacent discrete n-grade segment to define a plurality of separation distances. In certain embodiments of the invention, the plurality of depths may be the same, while in certain other embodiments of the invention, the plurality of depths are increasing.

According to an embodiment of the invention, the semiconductor may be a lateral diffuse metal oxide semiconductor (LDMOS). In certain embodiments of the invention, each of the depths between of the p-top segments, the widths of the p-top segments, and the separation distances are such that there is at least about a 11.6% reduction in on-resistance at a drain voltage of about 1 volt in comparison to another LDMOS device having a continuous p-top region disposed below a continuous n-grade region. In certain embodiments of the invention, a breakdown voltage of the LDMOS device is about the same as a breakdown voltage of the LDMOS device having a continuous p-top region.

In certain embodiments of the invention, the plurality of discrete n-grade segments have a depth in the HVNW to define a plurality of depths, a width to define a plurality of widths and a separation distance from a vertically adjacent discrete p-top segment to define a plurality of separation distances and are such that there is at least about a 11.6% reduction in on-resistance at a drain voltage of about 1 volt in comparison to another LDMOS device having a continuous p-top region disposed below a continuous n-grade region.

In an embodiment of the invention, the MOS device is a LDMOS device and the HVNW has an n+ doped drain region.

The MOS device may additionally comprise a field oxide isolation region to isolate the first p+ doped region from the second p+ doped region that is adjacent to the n+ doped source region and the doped region of the HVNW. For example, the field oxide isolation region LDMOS device isolates the first p+ doped region from the second p+ doped region that is adjacent to the n+ doped source region and the n+ doped drain region of the HVNW.

The MOS structure may additionally comprise a gate structure disposed between the n+ doped source region and the dope region of the HVNW. For example, the LDMOS device comprises a gate structure disposed between the n+ doped source region and the n+ dope drain region of the HVNW.

In certain embodiments of the invention, the MOS device may be an insulated gate bipolar transistor wherein a third p+ doped region is disposed in the HVNW. In certain embodiments of the invention, the MOS device may be a diode wherein an n+ doped drain region is disposed in the HVNW.

An aspect of the invention also provides a method for fabricating a MOS device comprising the steps of providing a p-substrate, forming a high voltage n-well (HVNW) into the p-substrate, forming a first p-well in the p-substrate, forming a second p-well in the HVNW, forming a discrete n-grade and discrete p-top region in the HVNW, the discrete n-grade and discrete p-top region having at least one layer, wherein each layer comprises a plurality of discrete p-top segments dispersed among a plurality of discrete n-grade segments in the HVNW.

The method of fabricating a MOS device may additionally comprise forming a field oxide isolation region. The field oxide isolation having a first field structure overlapping the first p-well and the second p-well and a second field oxide structure overlapping the n-grade region.

The method fabricating a MOS device may additionally comprise forming a gate structure. For example, a gate structure may be formed by performing a gate oxidation, forming a polysilicon layer, and forming a spacer surrounding the gate structure.

The method of fabricating a MOS device may additionally comprise the steps of forming an n+ doped source region in the second p-well adjacent to the gate structure, forming a first p+ doped region in the first p-well, forming a second p+ doped region in the second p-well, and forming a doped region adjacent to the second field oxide structure in the HVNW.

In certain embodiments of the invention, the doped region may be an n+ doped drain region and the MOS device may be either a LDMOS device or a diode. In certain other embodiments of the invention, the doped region may be another p+ doped region and the MOS device may be an insulated gate bipolar transistor.

In the case of the LDMOS device, the number of p-top segments, the widths of the p-top segments, the distances of each of the p-top segments from the n-grade region, and the separation distances between the p-top segments are such that there is at least about a 15% reduction at a drain voltage of about 1 volt in comparison to another LDMOS device having a continuous p-top region.

Another aspect of the invention further comprises a product fabricated from the methods of the invention.

These embodiments of the invention and other aspects and embodiments of the invention will become apparent upon review of the following description taken in conjunction with the accompanying drawings. The invention, though, is pointed out with particularity by the appended claims.

BRIEF DESCRIPTION OF THE SEVERAL
VIEWS OF THE DRAWING(S)

Having thus described the invention in general terms, reference will now be made to the accompanying drawings, which are not necessarily drawn to scale, and wherein:

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

As used in the specification and in the appended claims, the singular forms "a", "an", and "the" include plural referents unless the context clearly indicates otherwise. For example, reference to "a p-top segment" includes a plurality of such p-top segments.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise.

As used herein, "MOS device" refers to a metal oxide semiconductor device. Lateral diffused metal oxide semiconductor (LDMOS), N-channel metal oxide semiconductor (NMOS), insulated gate bipolar transistor (IGBT), and diodes are each examples of a MOS device. Such devices may be designed to accommodate high voltages or even ultra-high voltages relative to other semiconductor devices.

As used herein, "LDMOS device" refers to a metal oxide field effect transistor (MOSFET) having coplanar source and drain regions. According to certain embodiments, the LDMOS device of the invention is characterized by a high breakdown voltage and a low on-state resistance. The LDMOS devices of the invention and methods of manufacturing such devices may result in a LDMOS device having a relatively high breakdown voltage. Additionally, LDMOS devices of the invention and methods of manufacturing such devices may result in a LDMOS device having a relatively low on-state resistance in comparison to other LDMOS devices known in the art.

Figure 4:
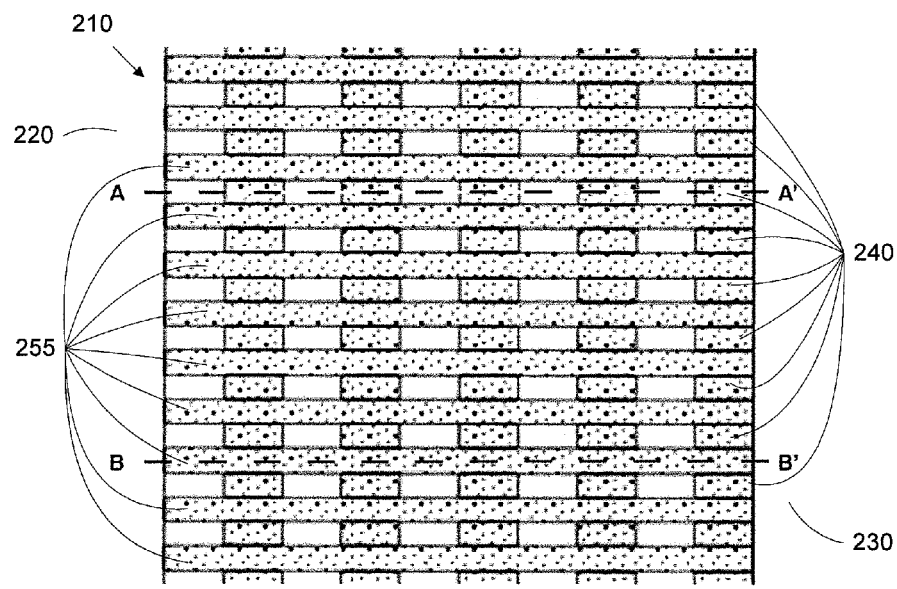
FIG. 4 illustrates a plan view of an LDMOS region according to an embodiment of the invention.

FIG. 4 illustrates a plan view of the LDMOS region 210 according to an exemplary embodiment of the invention. The LDMOS region 210 having a layer of a plurality of discretely placed n-grade diffusion segments interposed with a plurality of discretely placed p-type diffusion segments otherwise known herein as a discrete n-grade and discrete p-top region 240. The discrete n-grade and discrete p-top region 240 extends from a source side 220 to the drain side 230 of the LDMOS region 210. The discrete n-grade and discrete p-top region 240 is disposed in a high voltage n-type well (HVNW). Thus, the LDMOS region 210, according to an embodiment of the invention, is defined by a multiplicity of the discrete n-grade and discrete p-top regions 240 each separated by a non-discretely placed n-grade region 255 that does not include a plurality of discretely placed n-grade segments or any discretely placed p-top segments.

Figure 5A:
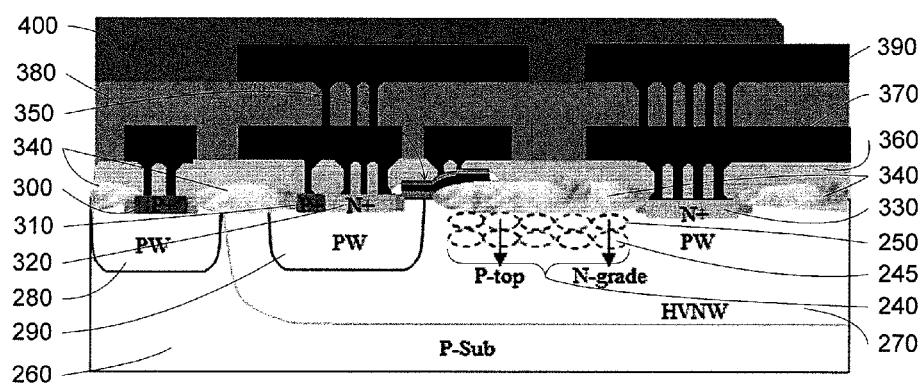
FIG. 5A illustrates a cross sectional view of an LDMOS region shown in FIG. 4 taken along section lines AA' according to an embodiment of the invention.

FIG. 5A is a cross-sectional view of FIG. 4 taken along the AA' section line according to an embodiment of the invention. This exemplary representation of a LDMOS device, according to an embodiment of the invention, has a p-type semiconductor substrate or a p-substrate 260, which may be formed in whole or in part as a p-type layer, such as a p-type epitaxial layer, in which an HVNW 270 has been disposed. A first p-well 280 is formed in the p-substrate 260 while a second p-well 290 is formed in the HVNW 270, the first p-well 280 having a p+ doped region 300 and the second p-well 290 having another p+ doped region 310 adjacent to an n+ doped source region 320. An n+ doped drain region 330 has been formed in the HVNW 270. This section of the LDMOS region 210 includes a discrete n-grade and discrete p-top region 240 having a plurality of discrete n-grade segments 250 interposed with a plurality of discrete p-top segments 245. A field oxide isolation region 340 substantially separates the doped regions 300, 310 & 320, 330.

Any control gate structure 350 known in the art may be used in the LDMOS device. For example the control gate structure 350 may comprise a conductive layer disposed on a dielectric layer. The control gate structure 350 may additionally comprise dielectric sidewall spacers. An interlayer dielectric (ILD) layer 360 is disposed over the defined structure. A first metal layer 370 is provided having a network of contacts through the ILD layer 360. The exemplary embodiment of a LDMOS device illustrated in FIG. 4 additionally shows an inter-metal dielectric (IMD) layer 380 upon which is disposed a second etched metal layer 390 providing a network of contacts through the IMD layer 380.

Figure 1:
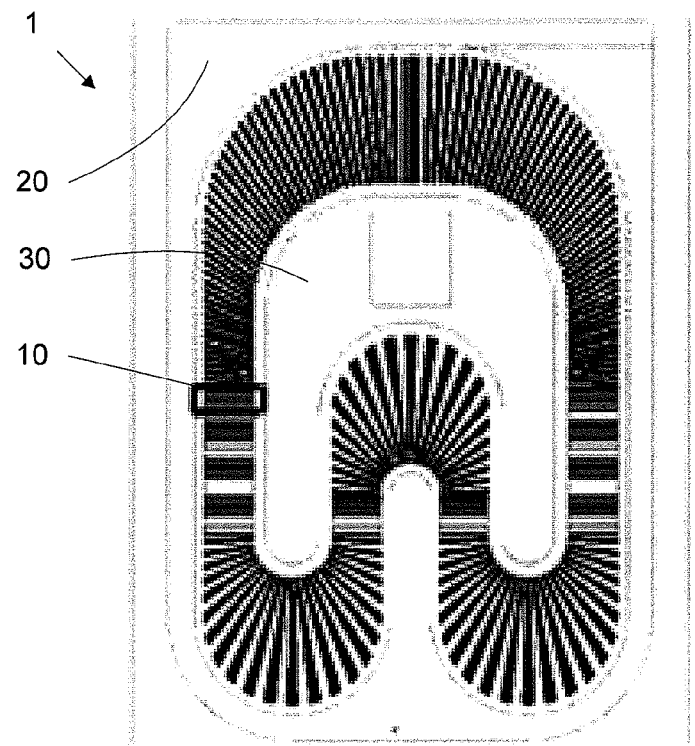
FIG. 1 illustrates a plan view of an LDMOS device.
Figure 2:
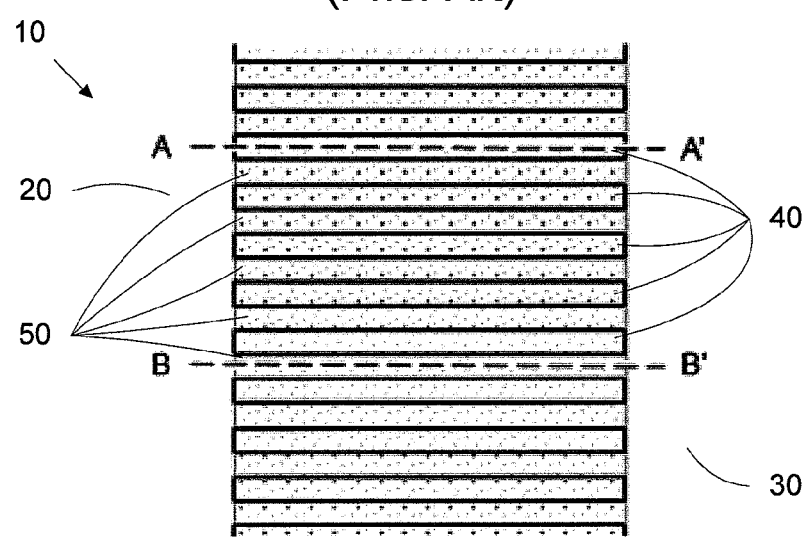
FIG. 2 illustrates a plan view of an LDMOS region.
Figure 3A:
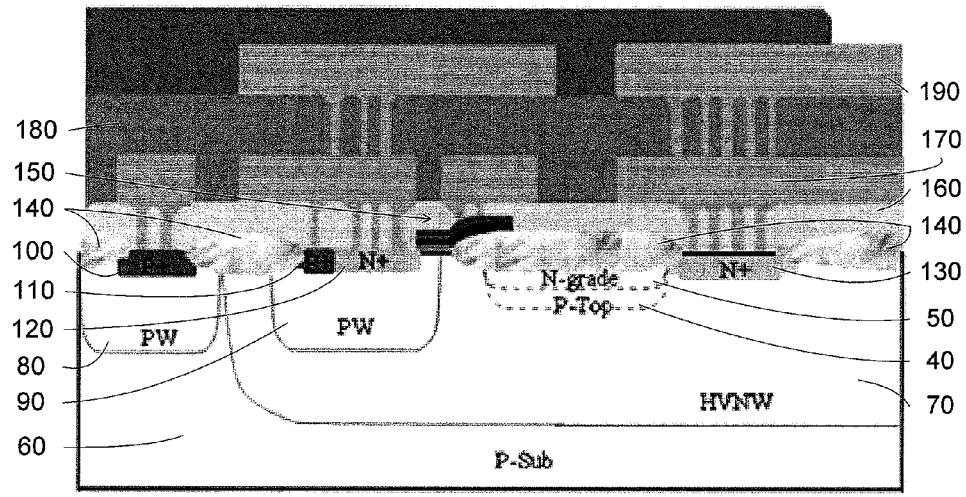
FIG. 3A illustrates a cross sectional view of the LDMOS region shown in FIG. 2 taken along section lines AA'.
Figure 3B:
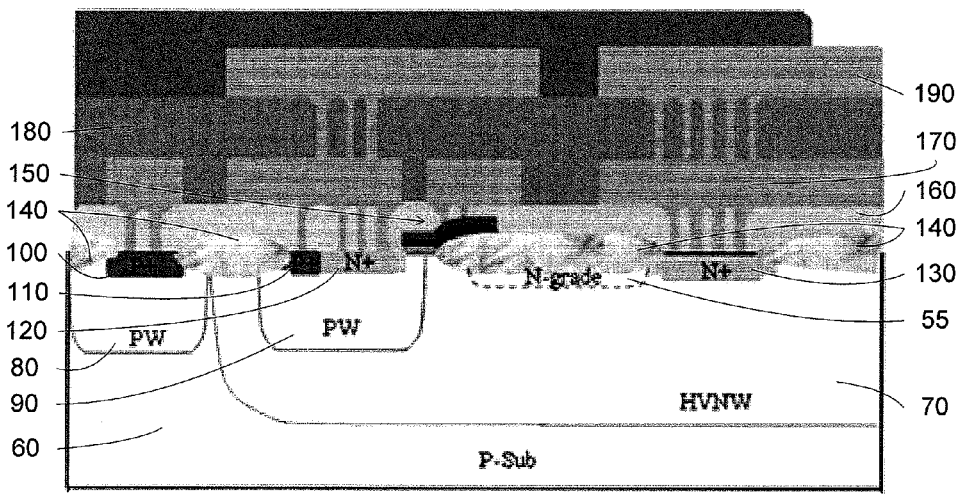
FIG. 3B illustrates a cross sectional view of the LDMOS region shown in FIG. 2 taken along section lines BB'.
Figure 5B:
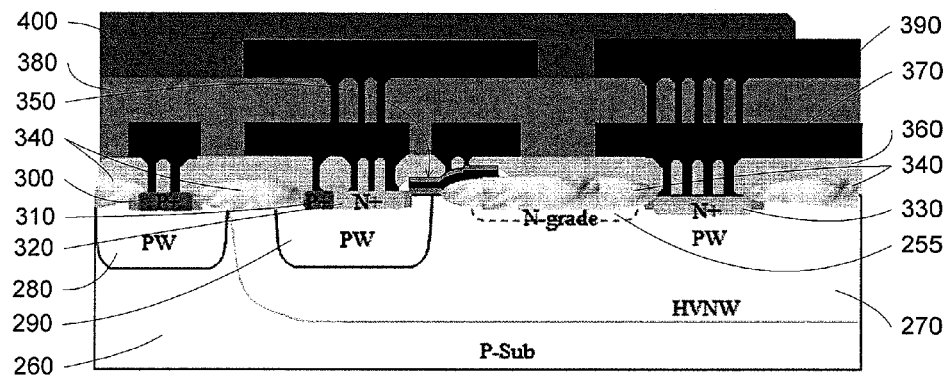
FIG. 5B illustrates a cross sectional view of an LDMOS region shown in FIG. 4 taken along section lines BB' according to an embodiment of the invention.

FIG. 5B is a cross-sectional view of FIG. 4 taken along the BB' section line. This cross-sectional view of the LDMOS device, according to an embodiment of the invention, has the same structure identified in FIG. 5A except that discrete n-grade segments and discrete p-top segments are not disposed in the HVNW 270. Rather, an n-grade region 255 is disposed in the HVNW 270. Thus, according to this exemplary embodiment of the invention, the cross section of the conventional structure as shown in FIG. 3B and the cross section of the LDMOS device of the invention as shown in FIG. 5B may be substantially similar. Of course, the cross section of the conventional structure as shown in FIG. 3A and the cross section of the LDMOS device of the invention as shown in FIG. 5A being different.

FIGS. 6A-17B are cross-sectional views of the LDMOS device after the completion of a described step in fabricating the LDMOS device of the invention. Each of the figures ending with an "A" are illustrative of the cross-section of the LDMOS device taken along the AA' section line of FIG. 4—i.e., showing the discrete n-grade and discrete p-top region 240—while each of the figures ending with a "B" are illustrative of the cross-section of the LDMOS device taken along the BB' section line of FIG. 4—i.e., showing only the n-grade region 255.

Figure 6A:
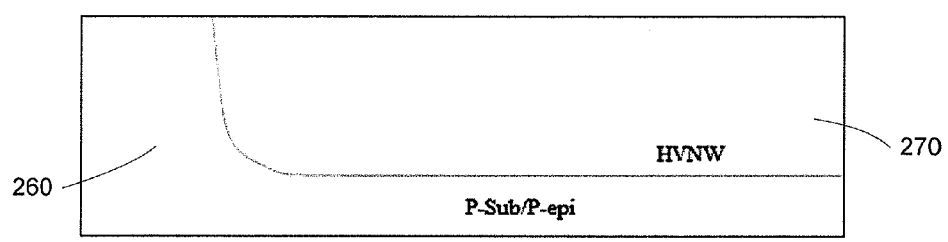
FIGS. 6A and 6B are cross-sectional views of FIG. 4 taken along the AA' and BB' section lines respectively after the high voltage n-well has been formed into the p-substrate according to an embodiment of the invention.
Figure 6B:
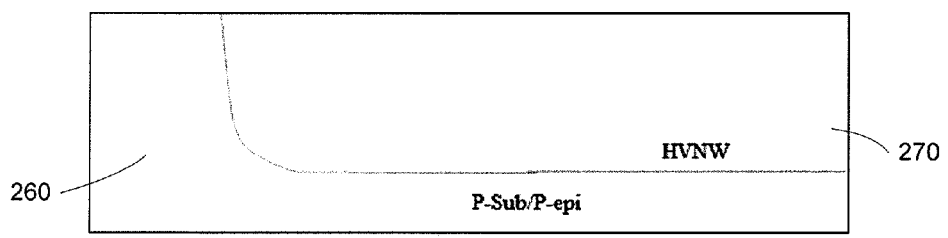

FIGS. 6A and 6B are cross-sectional views of FIG. 4 taken along the AA' and BB' section lines respectively after the high voltage n-well (HVNW) 270 has been formed into the p-substrate 260. The HVNW 270 extends downwardly beginning at an upper portion of the p-substrate 260. The process of forming the HVNW 270 typically may involve depositing a photoresist to define the region where the HVNW 270 will be formed into the p-substrate 260 followed by patterning and developing the desired pattern and location of the HVNW 270. An implantation may then be performed through the patterned and developed photomask and into, for example, an epitaxial layer of the p-substrate 260. In certain embodiments of the invention, the implantation is followed by an n-well drive-in step. The drive-in step typically occurs at an elevated temperature for some period of time. In certain embodiments of the invention, the elevated temperature of the drive-in step is anywhere in a range of from about 1,000° C. to about 1,150° C. for a period of time anywhere in a range of from about 20 minutes to about 2 hours. In certain embodiments of the invention, the drive-in process has a temperature of about 1,150° C. for about 1 hour. Any remaining photoresist typically may be commensurately removed with processing of the HVNW 270 or subsequently removed after processing of the HVNW 270 is complete.

Figure 7A:
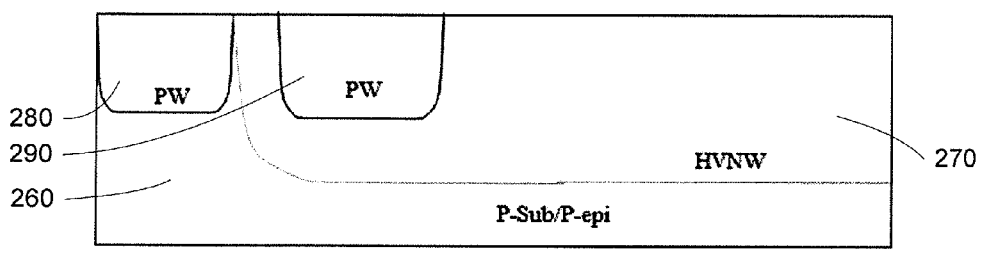
FIGS. 7A and 7B are cross-sectional views of FIG. 4 taken along the AA' and BB' section lines respectively after the first p-well is formed in the p-substrate and a second p-well is formed in the HVNW according to an embodiment of the invention.
Figure 7B:
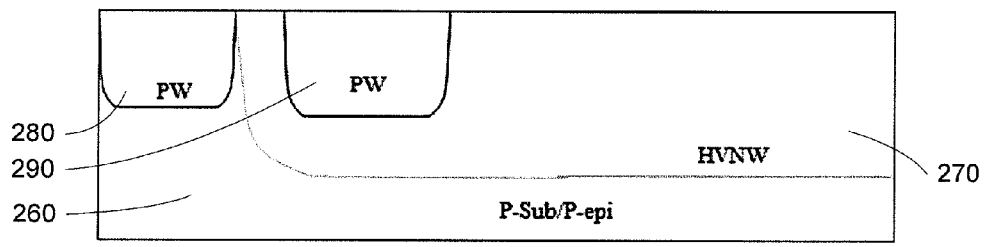

FIGS. 7A and 7B are cross-sectional views of FIG. 4 taken along the AA' and BB' section lines respectively after the first p-well 280 is formed in the p-substrate 260 and a second p-well 290 is formed in the HVNW 270. A p-type well may be formed by use of a photolithographic technique and introduction of a p-type impurity ion implantation into the desired layer. In certain embodiments of the invention, the ion implantation step may be followed by a p-well drive-in step, such as the conditions of the drive-in step as previously described herein. The process may also encompass the removal of any remaining photoresist. The first p-well 280 and the second p-well 290 may be substantially simultaneously formed or may be formed by using separate steps, with the latter technique being preferred if separate types of ions are to be implanted in the p-substrate 260 and the HVNW 270, respectively.

Figure 8A:
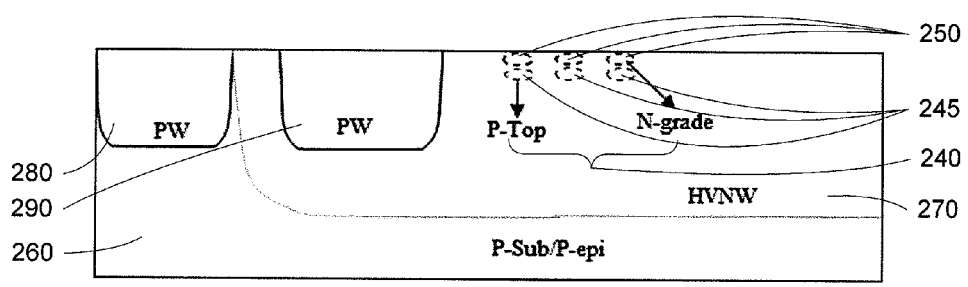
FIGS. 8A and 8B are cross-sectional views of FIG. 4 taken along the AA' and BB' section lines respectively after forming the first discrete n-well region and the first discrete p-top region in the HVNW according to an embodiment of the invention.
Figure 8B:
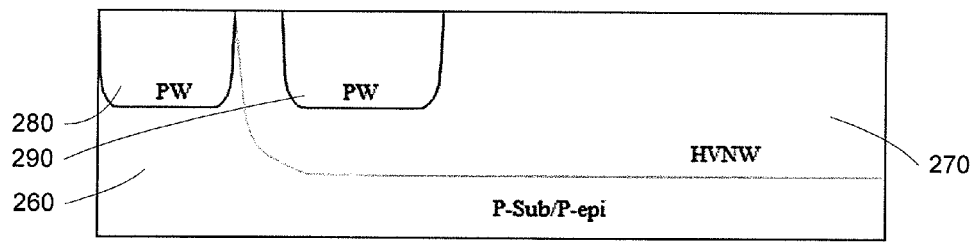

FIGS. 8A and 8B are cross-sectional views of FIG. 4 taken along the AA' and BB' section lines respectively after forming a region having a plurality of discrete p-top segments 245 and a layer having a plurality of discrete n-grade segments 250 in the HVNW 270. The plurality of discrete p-top segments 245 and the plurality of discrete n-grade segments 250 representing a discrete n-grade and discrete p-top region 240. The discrete p-top segments are defined p-type diffusion regions while the discrete n-grade segments are defined n-type diffusion regions.

For example, a first photoresist may be deposited for defining the region where the p-top segments 245 will be formed into the HVNW 270 followed by patterning and developing a first desired pattern identifying the location of the p-top segments 245 in the discrete n-grade and discrete p-top region 240. An implantation of p-type ions may then be performed through the first patterned and developed photomask depositing the plurality of p-top segments into the HVNW 270. Of course, the process for implanting the plurality of discrete p-top segments 245 may be concluded by removing any excess photoresist from the device. The first mask may be removed and a second photoresist may be deposited for defining the region where the n-grade segments 250 will be formed into the HVNW 270 followed by patterning and developing the desired pattern identifying the location of the n-grade segments 250 in the discrete n-grade and discrete p-top region 240. An implantation of n-type ions may be performed through the second patterned and developed photomask depositing the plurality of n-grade segments into the HVNW 270. It is well understand by a person having ordinary skill in the art that the steps and/or conditions at the one or more steps of the implantation process, for example, the energy of implantation, may be varied to achieve the preferred position of each of the p-top segments 245 and each of the n-grade segments 250 in the HVNW 270.

Figure 9A:
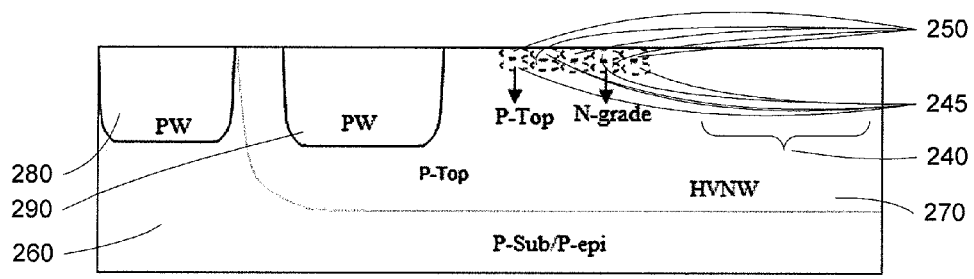
FIG. 9A is a cross-sectional view of FIG. 4 taken along the AA' section line after disposing the second discrete p-top region and the second discrete n-well region within the HVNW according to an embodiment of the invention.
Figure 9B:
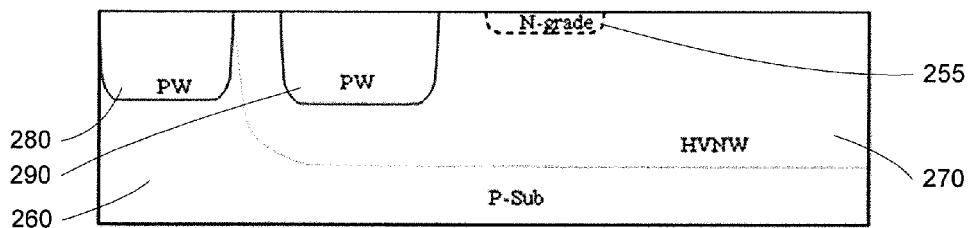
FIG. 9B is a cross-sectional view of FIG. 4 taken along the BB' section line after disposing the n-grade region within the HVNW according to an embodiment of the invention.

FIGS. 9A and 9B are cross-sectional views of FIG. 4 taken along the AA' and BB' section lines respectively after disposing additional n-grade segments 250 and p-top segments 245 in the discrete n-grade and discrete p-top region 240 of the HVNW 270. As earlier explained, a mask may be applied to the LDMOS device, for example using photolithography and an n-type dopant may be implanted into the HVNW 270 to define the additional n-grade segments 250 defining the discrete n-grade and discrete p-top region 240. The mask may be removed and another mask may be applied to the LDMOS device and a p-type dopant may be implanted into the HVNW 270 to define the additional p-top segments 250 defining the discrete n-grade and discrete p-top region 240. An n-grade region 255 is shown in FIG. 9B that is substantially free of any discrete p-top segments and a plurality of discrete n-grade segments.

Each of the plurality of p-top segments 245 and the plurality of n-grade segments 250 of the discrete n-grade and discrete p-top region 240 may be simultaneously formed or even formed over two or more photolithographic and implantation steps in forming the discrete p-top region 240. The exemplary embodiments of FIGS. 8A and 9A show a two-step process for implanting the plurality of discrete p-top segments 245 and the plurality of n-grade segments into discrete n-grade and discrete p-top region 240. Two more steps may be particularly useful when forming a discrete n-grade and discrete p-top region 240 having, for example, a variable number of n-grade segments 250 and p-top segments 245 and varying depths of such segments within the HVNW 270, variable concentrations of p-type ions within the p-top segments 245, variable concentrations of n-type ions within the n-grade segments 250 and/or layering of part or all of a p-top segment over an n-grade segment and vice versa, with such segments capable of being joined and or separated within the discrete n-grade and discrete p-top region 240.

According to other embodiments of the invention, any number of steps may be performed to achieve the desired orientation of the plurality of discrete p-top segments 245 and the plurality of n-grade segments 250 in the discrete n-grade and discrete p-top region 240. In an embodiment of the invention, the illustrative step of FIG. 9A need not be performed. I.e., the illustrative step of FIG. 8A may be sufficient to provide the desired orientation of the plurality of discrete p-top segments 245 and the plurality of n-grade segments 250 in the discrete n-grade and discrete p-top region 240.

According to certain embodiments of the invention, the n-type dopant may be selected, for example, from any one or more elements from a Group VA element of the Periodic Table, for example, phosphorus according to certain embodiments of the invention. In certain embodiments of the invention, the desired n-type ions may be formed from compounds having at least one element from Group VA with at least one element from Group IVA, for example, having a general form of $Si_xP_y$.

According to certain embodiments of the invention, a p-type dopant may be selected, for example, from any one or more elements from a Group IIIA element of the Periodic Table with boron, for example, being commonly selected according to certain embodiments of the invention. In certain embodiments of the invention, the desired p-type ions may be formed from compounds having at least one element from Group IIIA with at least one element from Group IVA. For example, according to an embodiment of the invention, the p-type ion may have the general formula $Si_xB_y$.

In certain embodiments of the invention, the discrete n-grade and discrete p-top region 240 comprises two, three, four, five, six, seven, eight, nine, or ten or more discrete p-top segments 245 and comprises two, three, four, five, six, seven, eight, nine, or ten or more discrete n-grade segments 250.

Without intending to be bound by theory, notwithstanding the variations in the number of discrete p-top segments 245 and the number of discrete n-grade segments 250, the concentration of p-type dopant in the discrete p-top segments may be balanced with the concentration of n-type dopant in the discrete n-grade segments. Without further intending to be bound by theory, the discrete n-grade and discrete p-top region 240 may be configured to improve charge balancing and to reduce the specific on-resistance of the LDMOS device. Yet without further intending to be bound by theory, the discrete n-grade and discrete p-top region 240 is configured to allow for downward depletion into the extended drain region of the HVNW 270 in combination with upward depletion from the p-substrate 260 to not be materially affected providing a substantially similar breakdown voltage to conventional LDMOS devices. Doping of the HVNW 270 may then be such that a lower specific on-resistance may be achieved.

In certain embodiments of the invention, the discrete n-grade and discrete p-top region 240 may be disposed proximate to the second p-well 290. For example, the number of discrete p-top segments, the positioning of each of the p-top segments within the HVNW 270, the positioning of each of the p-top segments relative to each other and relative to the other n-grade segments, as well as other parameters, as further described herein, will affect the extent of reduction in specific on-resistance of the LDMOS device. Additionally, the number of discrete n-grade segments, the positioning of each of the n-grade segments within the HVNW 270, the positioning of each of the n-grade segments relative to each other and relative to the other p-top segments, as well as other parameters, as further described herein, will affect the extent of reduction in specific on-resistance of the LDMOS device.

Finally, an n-grade region 255 is shown in FIG. 9B that is substantially free of any discrete p-top segments and a plurality of discrete n-grade segments.

Figure 10A:
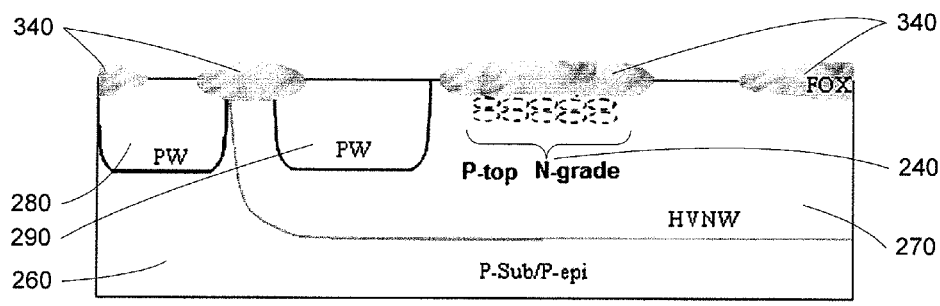
FIGS. 10A and 10B are cross-sectional views of FIG. 4 taken along the AA' and BB' section lines respectively after forming the field oxide isolation region according to an embodiment of the invention.
Figure 10B:
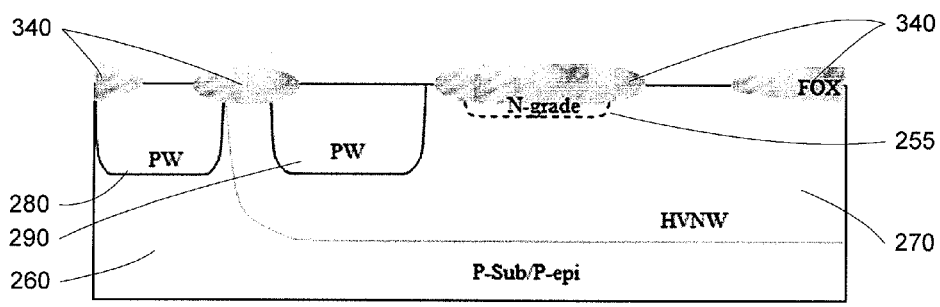

FIGS. 10A and 10B are cross-sectional views of FIG. 4 taken along the AA' and BB' section lines respectively after forming the field oxide isolation region 340. According to an embodiment of the invention, the field oxide isolation region 340 may comprise a plurality of field oxide isolation structures separating various regions of the LDMOS device. For example, in the exemplary embodiment of FIGS. 10A and 10B, the field oxide isolation region 340 comprises field oxide isolation structures separating various doped regions that will eventually be formed in the first p-well 280, the second p-well 290, and the HVNW 270.

According to an embodiment of the invention, the field oxide isolation region 340 may be formed by first applying a relatively thick layer of field oxide, for example, 1 micron or greater according to some embodiments of the invention, is grown along the top surface of the LDMOS device and then masked and etched to defined certain portions of the top surface, as represented in FIGS. 10A and 10B.

In certain other embodiments of the invention, the field oxide isolation region 340 may be grown and then etched to isolate certain regions of the LDMOS device. For example, a substantially uniform field oxide layer may be applied using a field oxide diffusion. A photoresist may be applied to the grown field oxide layer and then patterned and developed to identify areas where certain portions of the field oxide isolation layer may be etched away. Following the etching process, any remaining photoresist may be removed, and a plurality of field oxide structures remain to define the field oxide isolation region 340. In certain other embodiments of the invention, a precursor material such as a pad oxide and/or a silicon nitride may be similarly applied, and a field oxide oxidation process creates the field oxide in the structures that are defined by etching.

Figure 11A:
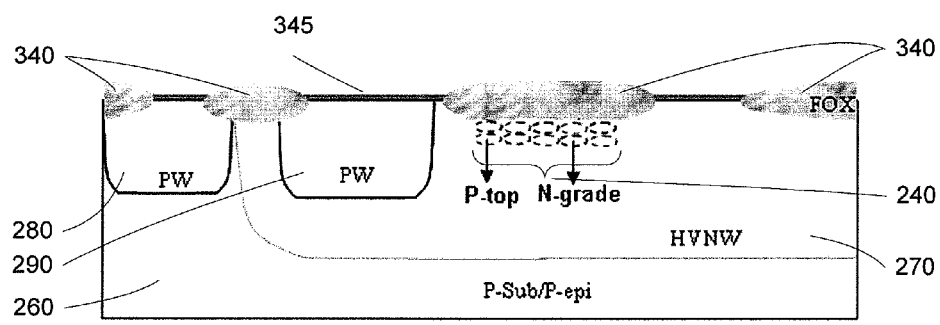
FIGS. 11A and 11B are cross-sectional views of FIG. 4 taken along the AA' and BB' section lines respectively after performing a gate oxidation process according to an embodiment of the invention.
Figure 11B:
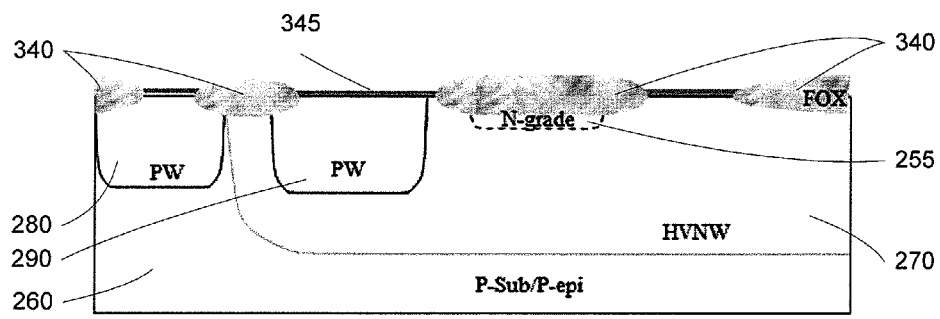

FIGS. 11A and 11B are cross-sectional views of FIG. 4 taken along the AA' and BB' section lines respectively after performing a gate oxidation process to form a gate oxide layer 345. The gate oxidation process may comprise a sacrificial oxidation step whereby an oxide is grown into a silicon surface by exposing the silicon surface to oxygen under certain conditions over a period of time. Typically, the sacrificial oxidation process is carried out at an elevated temperature, for example, a temperature in a range of from about 800° C. to about 1,000° C. or even greater. In certain embodiments of the invention, the elevated temperature may be within the range of from about 850° C. to about 950° C. In yet other embodiments of the invention, the elevated temperature may be about 900° C.

The sacrificial oxidation process may be followed by a gate clean process or, more appropriately, a pre-gate clean process to remove native oxide from the surface where the control gate will be applied. Any pre-gate clean process known in the art may be used. For example, the pre-gate clean process may employ the use of HF, HCl, or ozone to clean the desired area where a gate oxide is to be formed. Finally, a gate oxidation step may be employed to form a gate oxide layer 345.

Figure 12A:
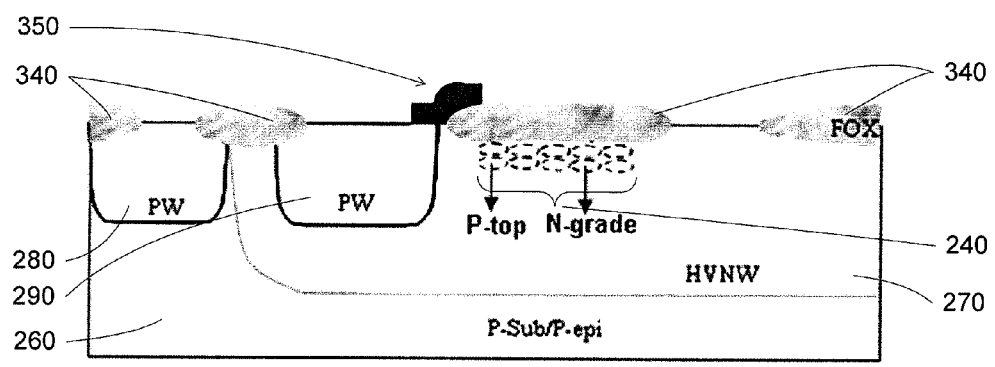
FIGS. 12A and 12B are cross-sectional views of FIG. 4 taken along the AA' and BB' section lines respectively after forming a polysilicon layer of the control gate structure according to an embodiment of the invention.
Figure 12B:
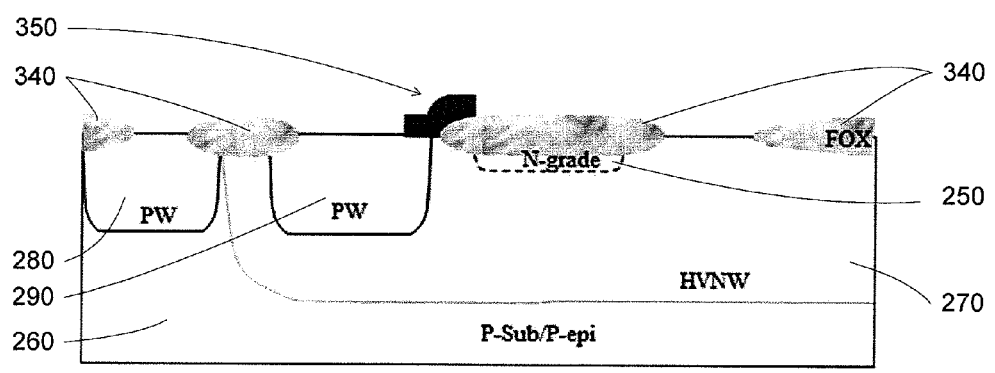

FIGS. 12A and 12B are cross-sectional views of FIG. 4 taken along the AA' and BB' section lines respectively after forming a polysilicon layer of the control gate structure 350. The process of forming the polysilicon layer may comprise depositing, typically using a chemical vapor deposition process, a polysilicon on the gate oxide layer 345. The polysilicon deposition may be followed by depositing a tungsten silicide ($WSi_x$), which, in combination with the polysilicon layer, is known as the polycide. A photolithographic processing step may be used to define the region where the polycide layer will remain after etching. Upon completion of etching, the polysilicon layer defining the control gate structure 350 remains.

Figure 13A:
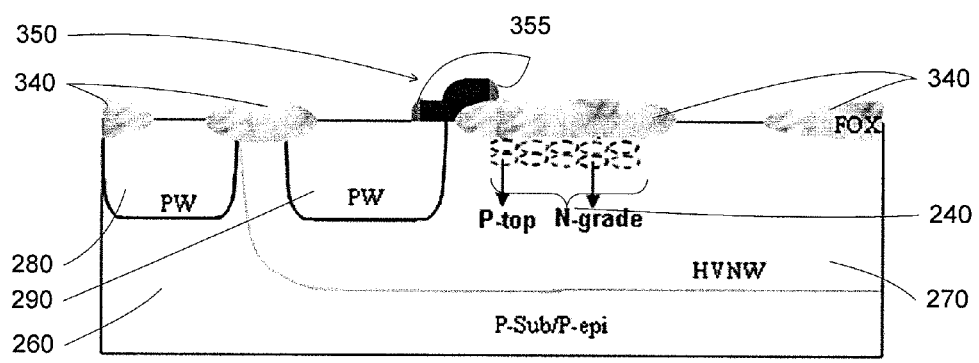
FIGS. 13A and 13B are cross-sectional views of FIG. 4 taken along the AA' and BB' section lines respectively after forming a spacer surrounding the control gate structure according to an embodiment of the invention.
Figure 13B:
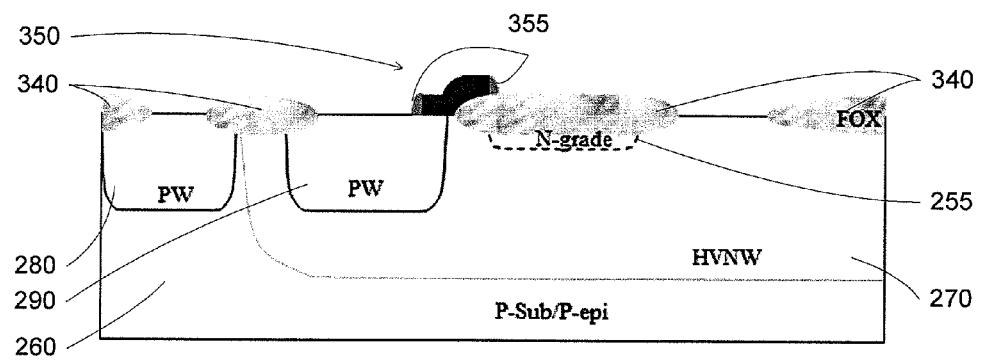

FIGS. 13A and 13B are cross-sectional views of FIG. 4 taken along the AA' and BB' section lines respectively after forming a spacer 355 surrounding the polysilicon layer of the control gate structure 350. In an embodiment of the invention a conformal layer of tetraethylorthosilane (TEOS) may be deposited to the surface of the LDMOS device. Photolithography may be used to define the remaining spacer 355 surrounding the control gate structure 350. The masked surface may then be etched to form the spacer 355 surrounding the control gate structure 350. (More aptly, the spacer 355 may also be considered a part of the control gate structure 350.)

Figure 14A:
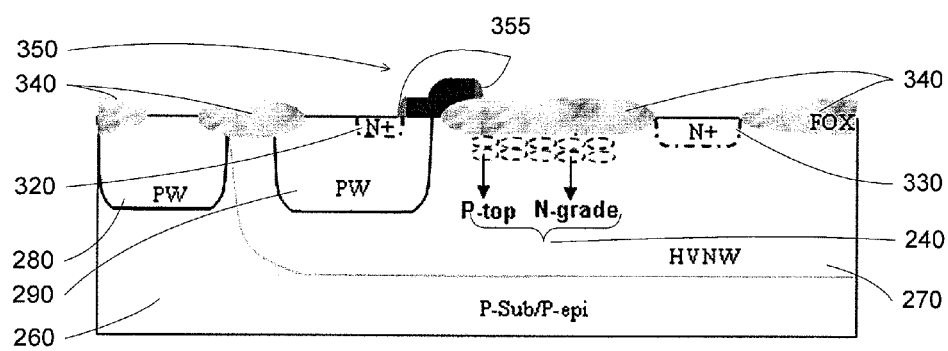
FIGS. 14A and 14B are cross-sectional views of FIG. 4 taken along the AA' and BB' section lines respectively after an n+ doped source region is formed in the second p-well and an n+ doped drain region is formed in the HVNW according to an embodiment of the invention.
Figure 14B:
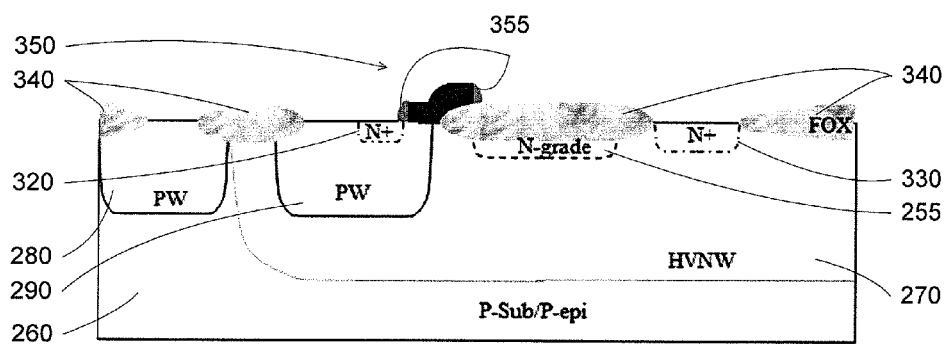

FIGS. 14A and 14B are cross-sectional views of FIG. 4 taken along the AA' and BB' section lines respectively after the n+ doped source region 320 is formed in the second p-well 290 and the n+ doped drain region 330 is formed in the HVNW 270. Each of the n+ doped regions 320, 330 may be implanted into their respective regions by depositing a photoresist to define where the n+ doped regions 320, 330 will be formed followed by patterning and developing the desired pattern identifying the location of the n+ doped regions 320, 330. n+ ions may then be implanted or injected into the regions defined by the photomask to form the n+ doped source region 320 into the second p-well 290 and the n+ doped drain region 330 into the HVNW 270. In certain embodiments of the invention, each of these n+ doped regions 320, 330 may be formed using separate procedures having steps similar to those define above.

Figure 15A:
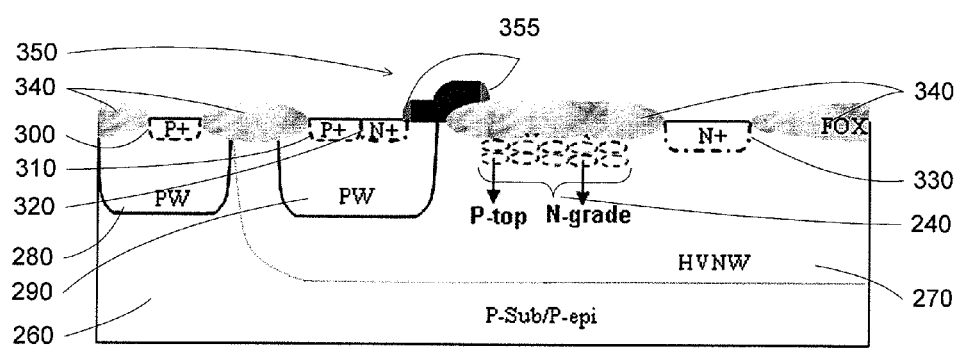
FIGS. 15A and 15B are cross-sectional views of FIG. 4 taken along the AA' and BB' section lines respectively after a p+ doped region is formed in the first p-well and another p+ doped region is formed in the second p-well according to an embodiment of the invention.
Figure 15B:
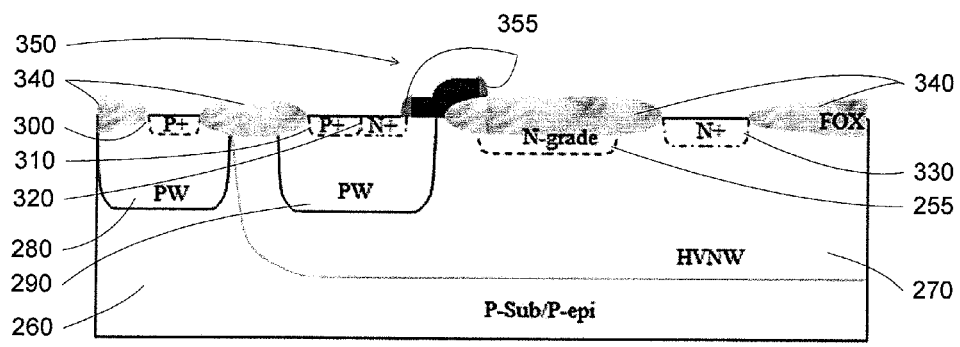

FIGS. 15A and 15B are cross-sectional views of FIG. 4 taken along the AA' and BB' section lines respectively after the p+ doped region 300 is formed in the first p-well 280 and the p+ doped region 310 is formed in the second p-well 290. In certain embodiments of the invention, the p+ doped region 310 of the second p-well 290 is adjacent to the n+ doped source region 320 of the second p-well 290.

Each of the p+ regions 300, 310 may be implanted into their respective regions by depositing a photoresist to define where the p+ regions 300, 310 will be formed followed by patterning and developing the desired pattern identifying the location of the p+ regions 300, 310. P+ ions may then be implanted or injected into the regions defined by the photomask to form the p+ region 300 into the first p-well 280 and the p+ region 310 into the second p-well 290. In certain embodiments of the invention, each of these p+ regions 300, 310 may be formed using separate procedures having steps similar to those define above.

Figure 16A:
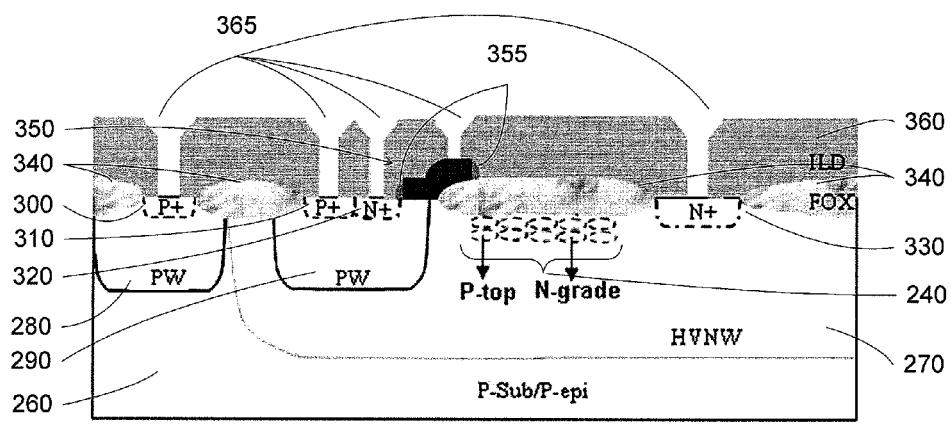
FIGS. 16A and 16B are cross-sectional views of FIG. 4 taken along the AA' and BB' section lines respectively after applying an interlayer dielectric layer according to an embodiment of the invention.
Figure 16B:
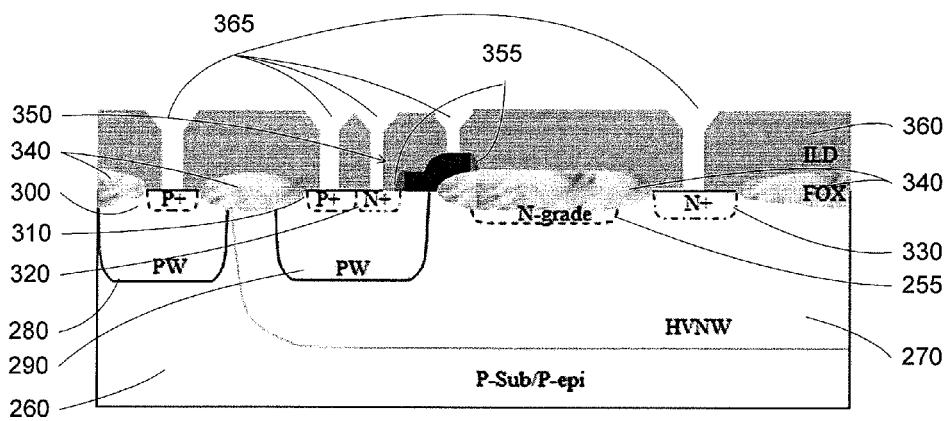

FIGS. 16A and 16B are cross-sectional views of FIG. 4 taken along the AA' and BB' section lines respectively after applying an interlayer dielectric (ILD) layer 360. The ILD layer 360 may be applied by first depositing an interlayer dielectric material to the LDMOS device. Photolithography may then be used to create a patterned photoresist to define the first core regions 365 where a conductive material will be applied. Finally the first core regions 365 will be etched to determine the structure of the ILD layer 360.

Figure 17A:
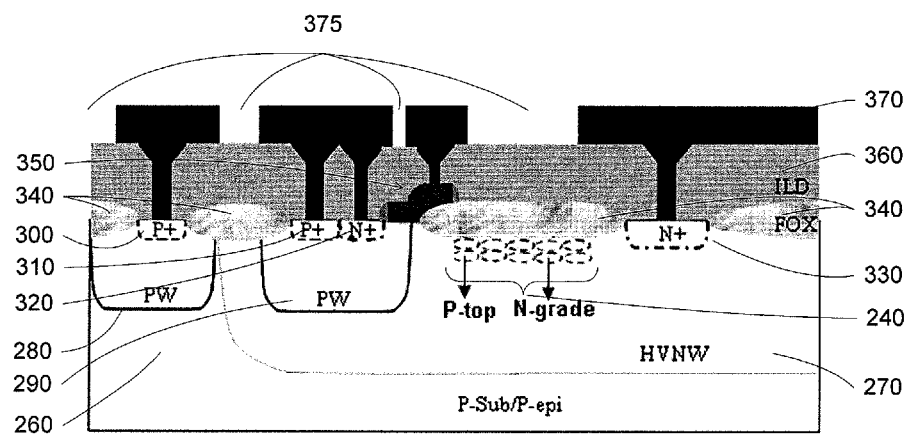
FIGS. 17A and 17B are cross-sectional views of FIG. 4 taken along the AA' and BB' section lines respectively after applying a first metal layer according to an embodiment of the invention.
Figure 17B:
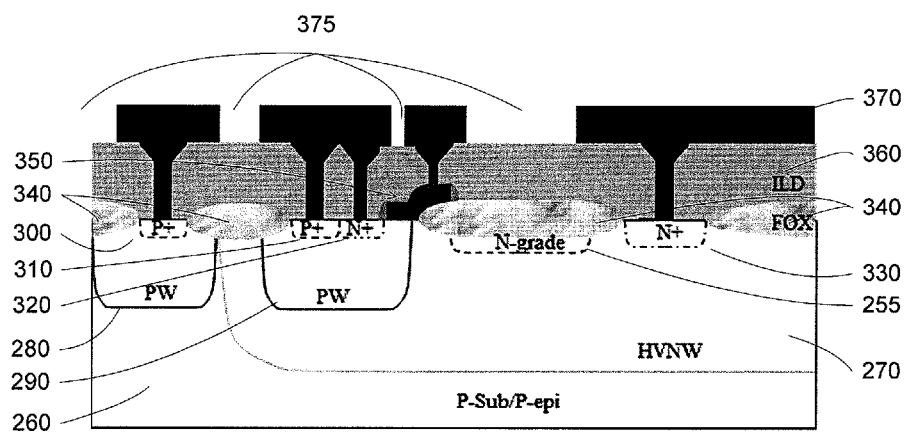

FIGS. 17A and 17B are cross-sectional views of FIG. 4 taken along the AA' and BB' section lines respectively after applying a first metal layer 370. A first metal of the first metal layer 370 may be deposited along the ILD layer 360 substantially filling the first core regions 365 defined within the ILD layer 360. Photolithography may then be used to create a patterned photoresist to define the isolation regions 375 where a dielectric material of the inter-metal dielectric (IMD) layer 380 will be applied. Finally the isolation regions 375 will be etched to determine the structure of the first metal layer 370.

Subsequent layers may similarly be applied. For example, as shown in the exemplary illustrative embodiment represented in FIGS. 5A and 5B an IMD layer 380 may be applied to the first metal layer 370. A second metal layer 390 having second isolation regions may then be applied to the IMD layer 380. Another dielectric layer 400, for example, may be applied to the second metal layer 390.

Figure 18A:
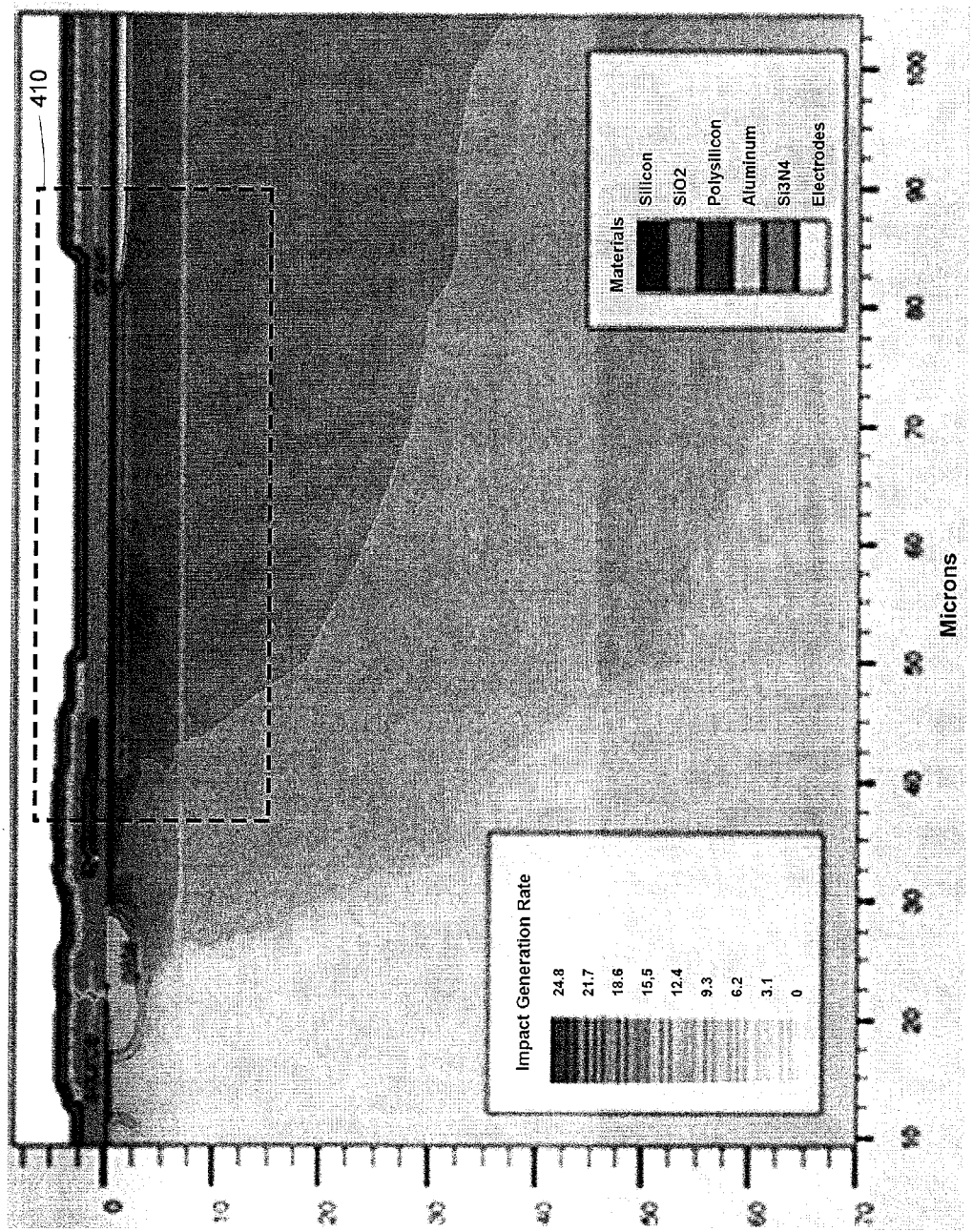
FIGS. 18A and 18B are graphical representations of a TCAD simulation showing the impact generation rate at breakdown for a conventional LDMOS device.
Figure 18B:
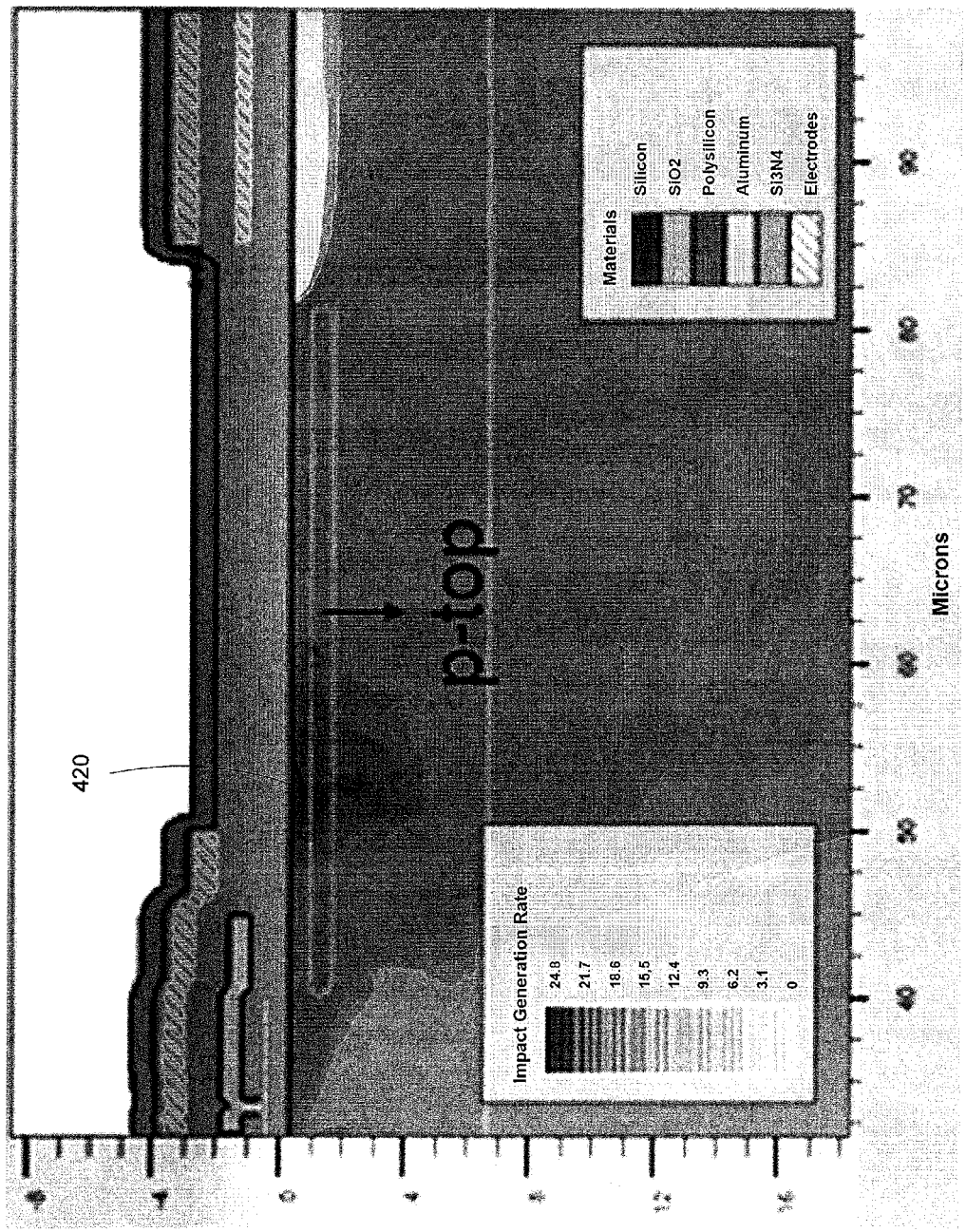
Figure 19A:
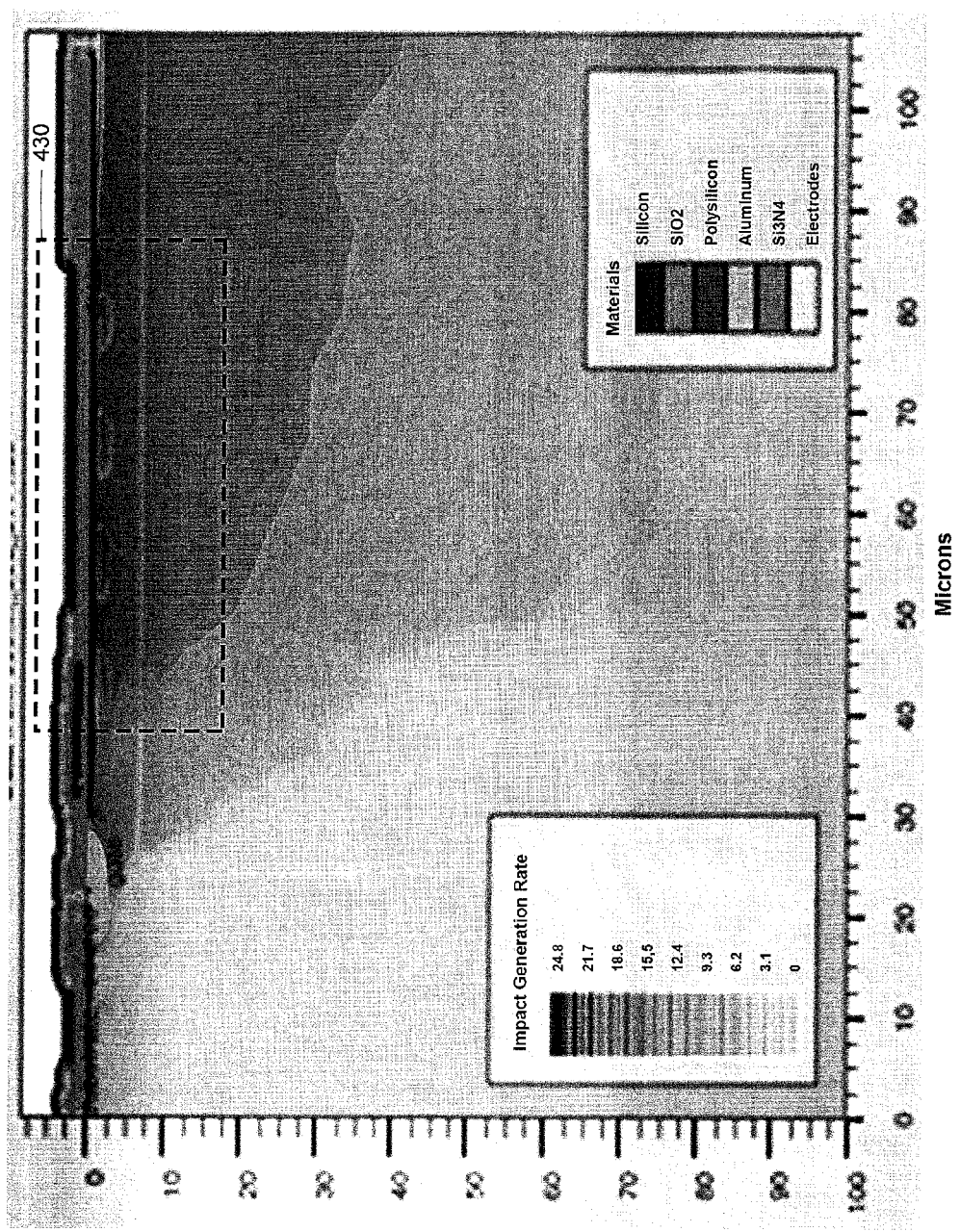
FIGS. 19A and 19B are graphical representations of a TCAD simulation showing the impact generation rate at breakdown for a LDMOS device according to an embodiment of the invention.
Figure 19B:
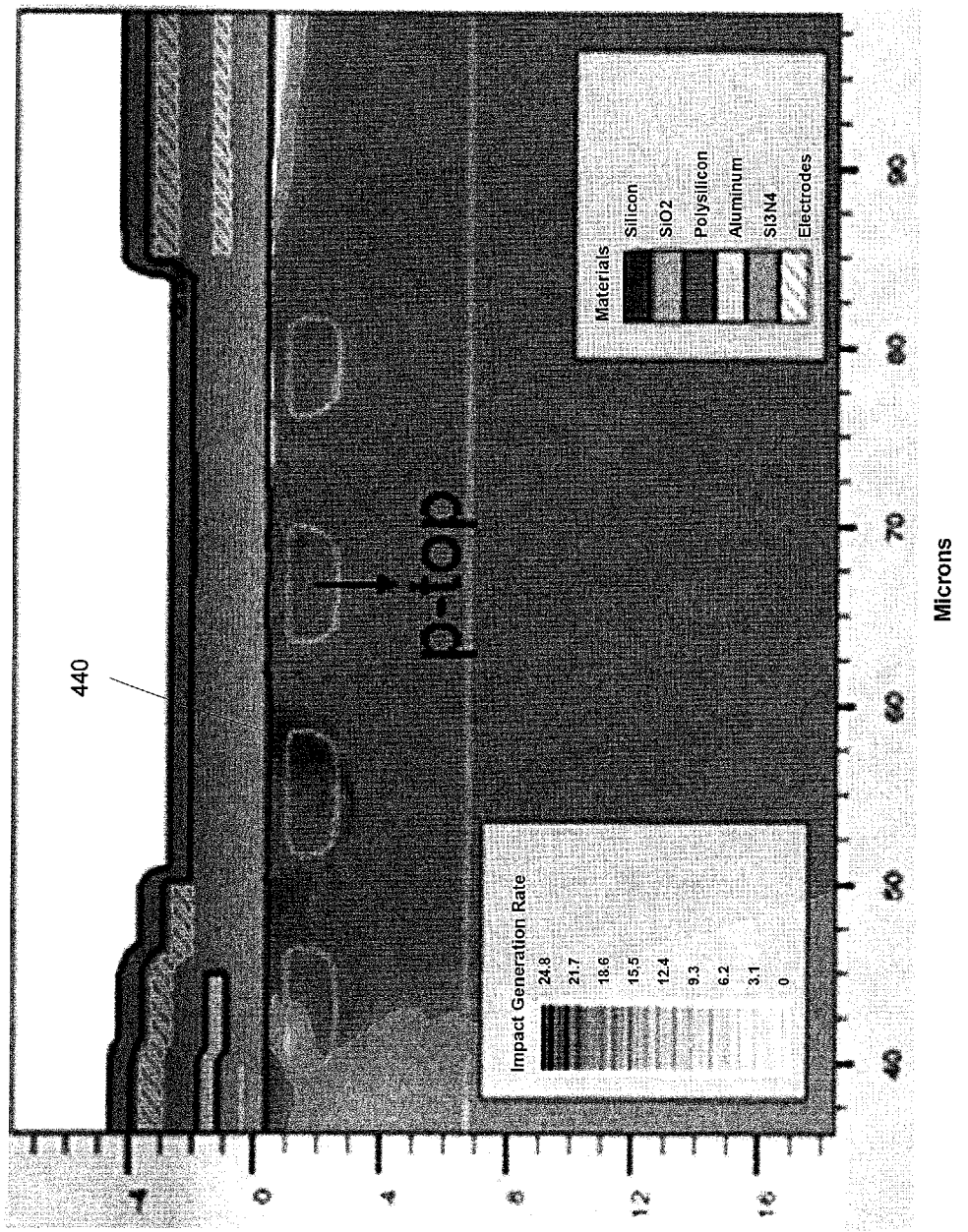

FIG. 18A is a graphical representation of a TCAD simulation showing the impact generation rate at breakdown for a conventional LDMOS device. FIG. 18B is a more detailed representation of the portion 410 identified in FIG. 18A. FIG. 18B shows the point 420 about where the maximum impact generation rate is experienced in the device. FIG. 19A is a graphical representation of a TCAD simulation showing the impact generation rate at breakdown for an exemplary LDMOS device of the invention. FIG. 19B is a more detailed representation of the portion 430 identified in FIG. 19A. FIG. 19B shows the point 440 about where the maximum impact generation rate is experienced in the device. FIGS. 18A-19B illustrate that the impact generation rate at breakdown is not materially affected by the discrete n-grade and discrete p-top region for the LDMOS device of the invention relative to the impact generation rate at breakdown for a conventional LDMOS device. Thus, the LDMOS device of the invention demonstrates a similar depression capability to that of a conventional device and the maximum breakdown voltage is not materially affected.

Figure 20A:
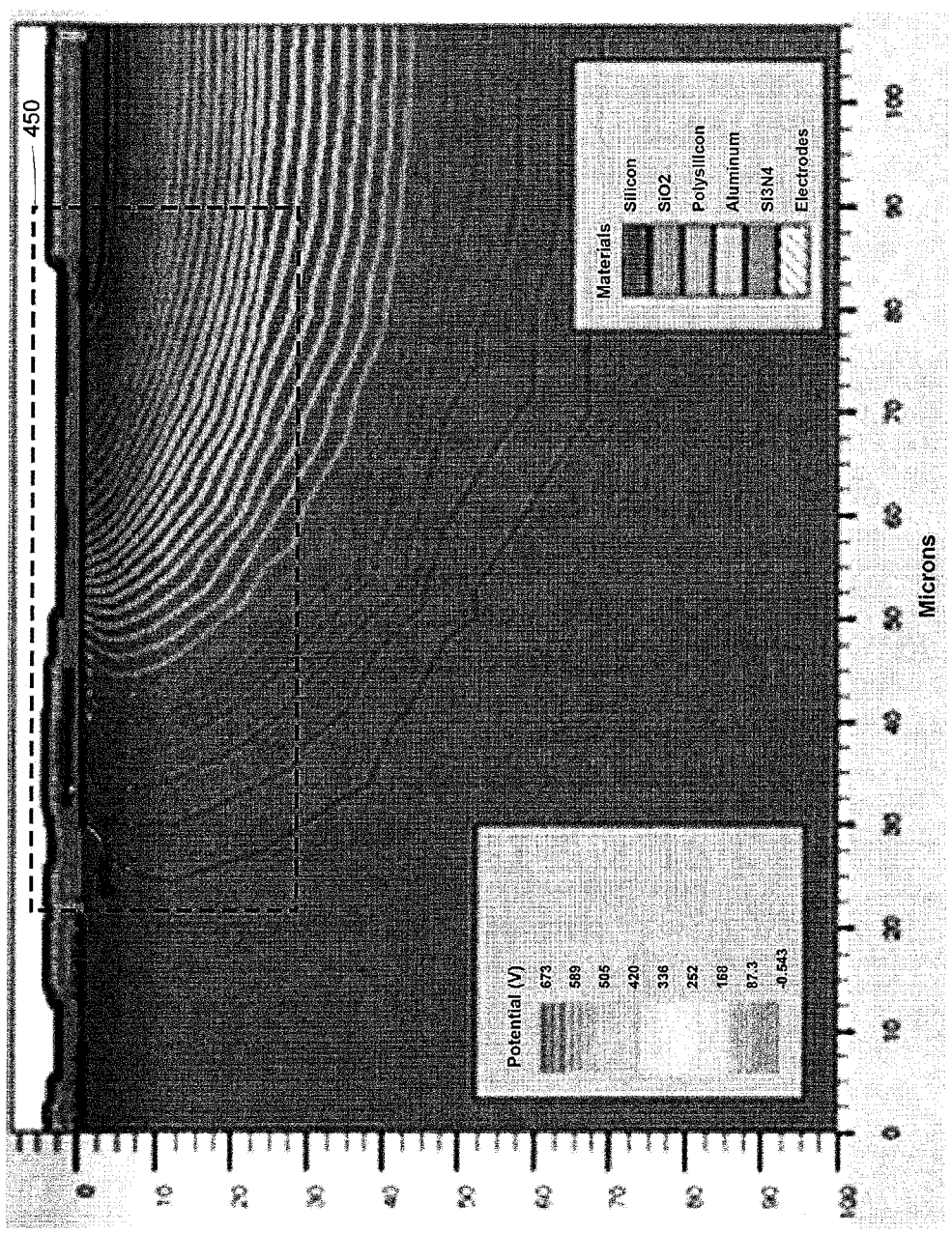
FIGS. 20A and 20B are graphical representations of a TCAD simulation showing the potential profile at breakdown for a conventional LDMOS device.
Figure 20B:
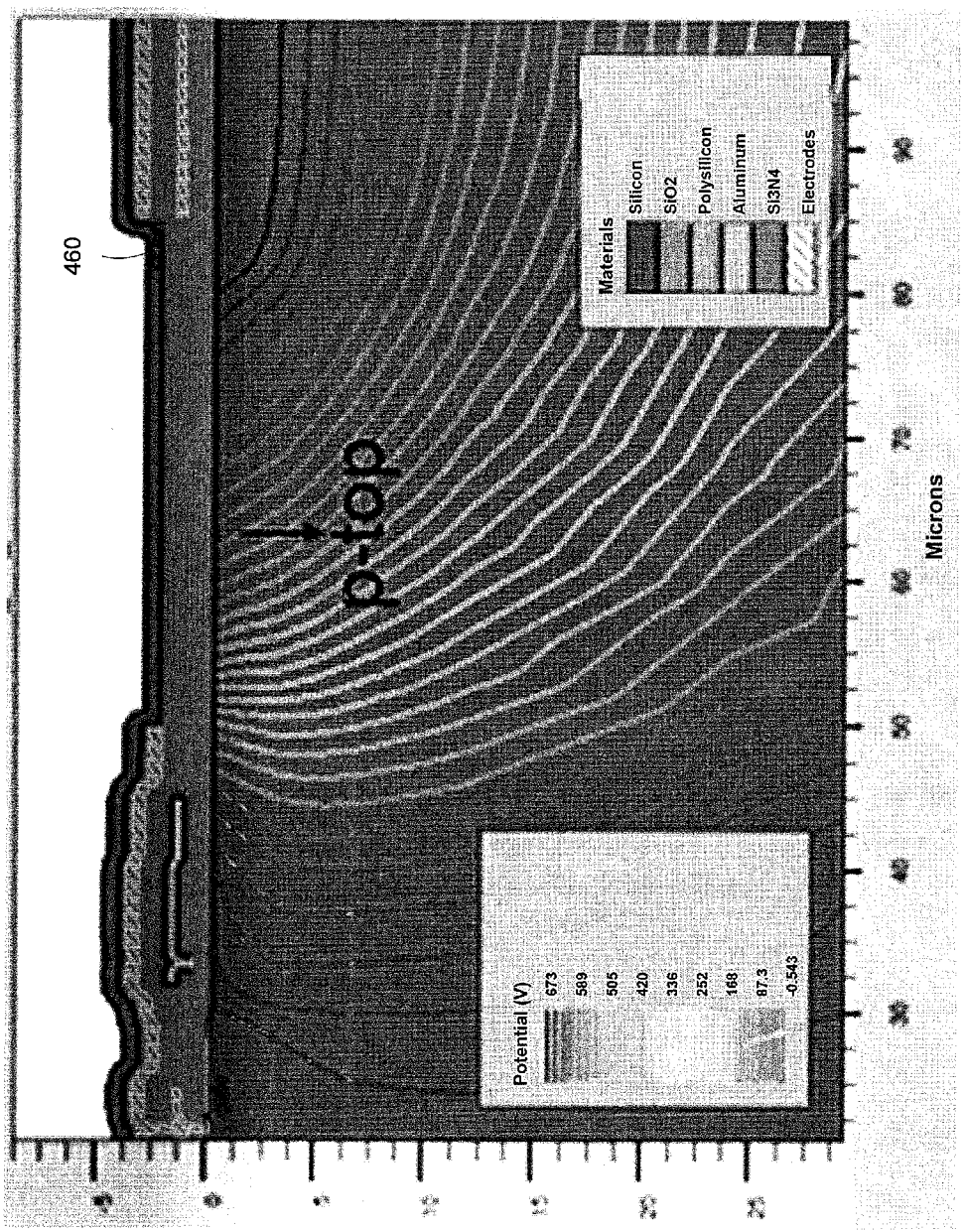
Figure 21A:
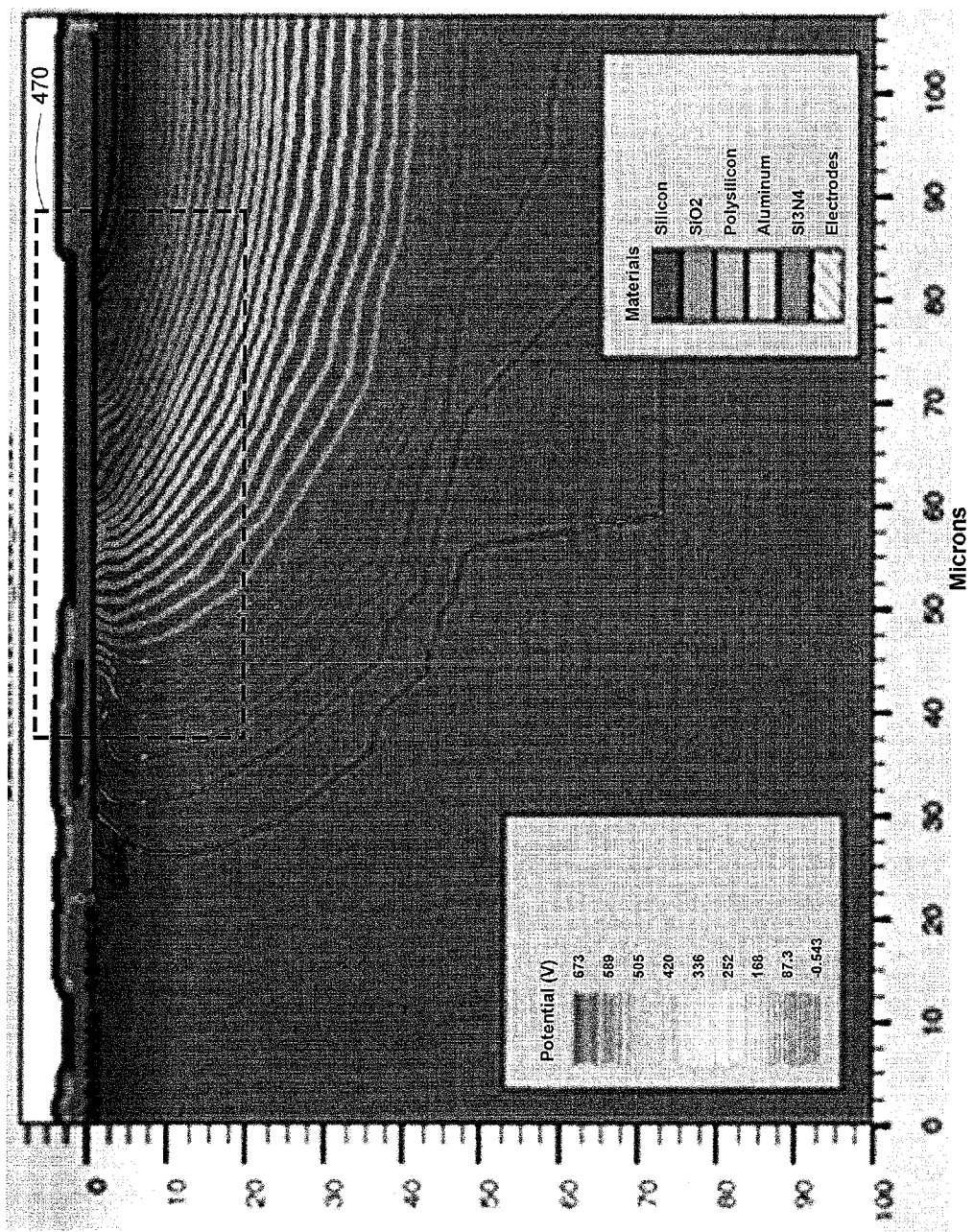
FIGS. 21A and 21B are graphical representations of a TCAD simulation showing the potential profile at breakdown for a LDMOS device according to an embodiment of the invention.
Figure 21B:
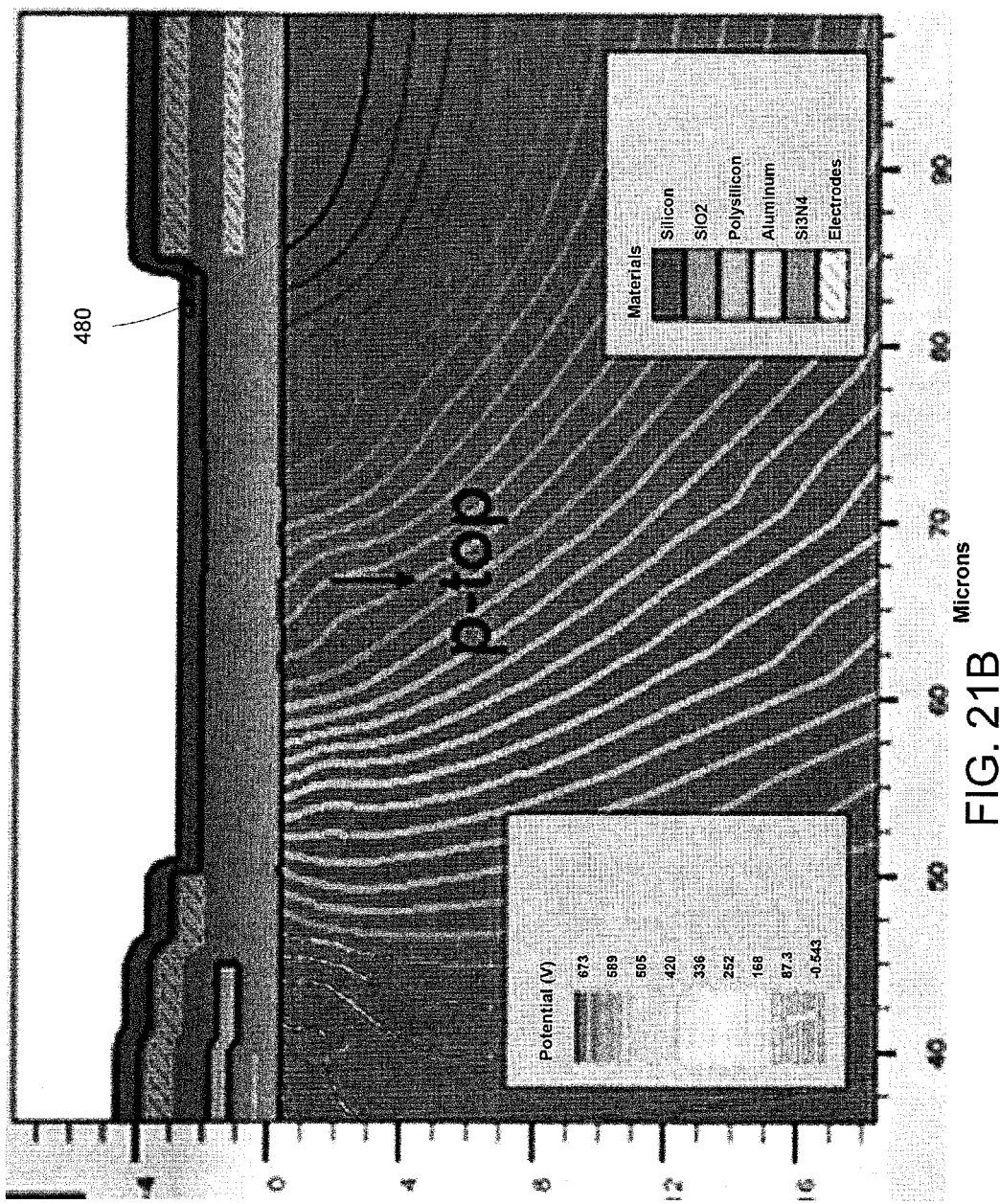

FIG. 20A is a graphical representation of a TCAD simulation showing the potential at breakdown for a conventional LDMOS device. FIG. 20B is a more detailed representation of the portion 450 identified in FIG. 20A. FIG. 20B shows the line 460 of greatest potential experienced in the device. FIG. 21A is a graphical representation of a TCAD simulation showing the potential at breakdown for an exemplary LDMOS device of the invention. FIG. 21B is a more detailed representation of the portion 470 identified in FIG. 21A. FIG. 21B shows the line 480 of greatest potential experienced in the device. FIGS. 20A-21B illustrate that the distribution of potential at breakdown is not materially different between a conventional LDMOS device and an LDMOS device of the invention. Thus, the LDMOS device of the invention demonstrates a potential profile at breakdown that is similar to that of a conventional device and the maximum breakdown voltage is not materially affected.

Figure 22A:
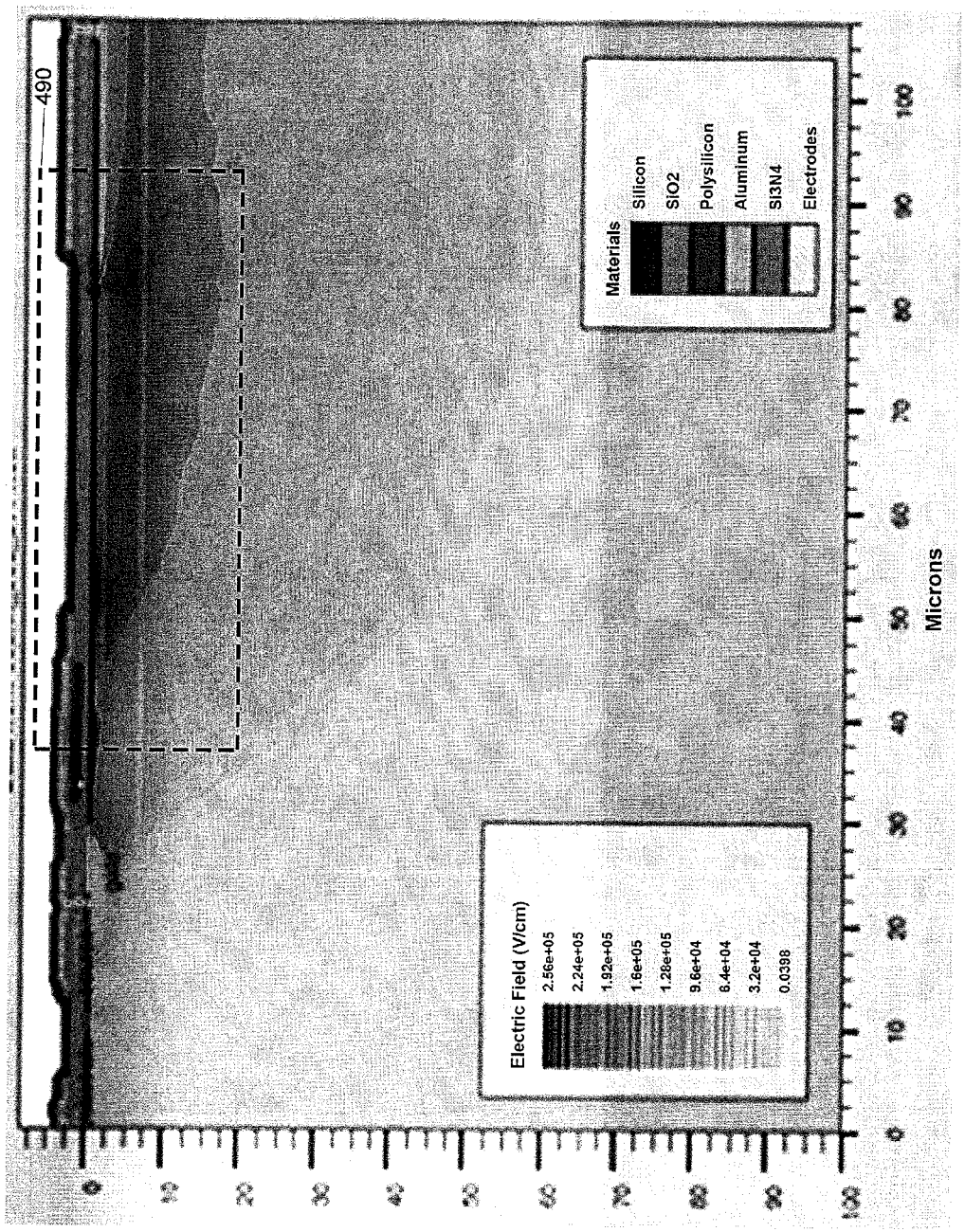
FIGS. 22A and 22B are graphical representations of a TCAD simulation showing the electric field at breakdown for a conventional LDMOS device.
Figure 22B:
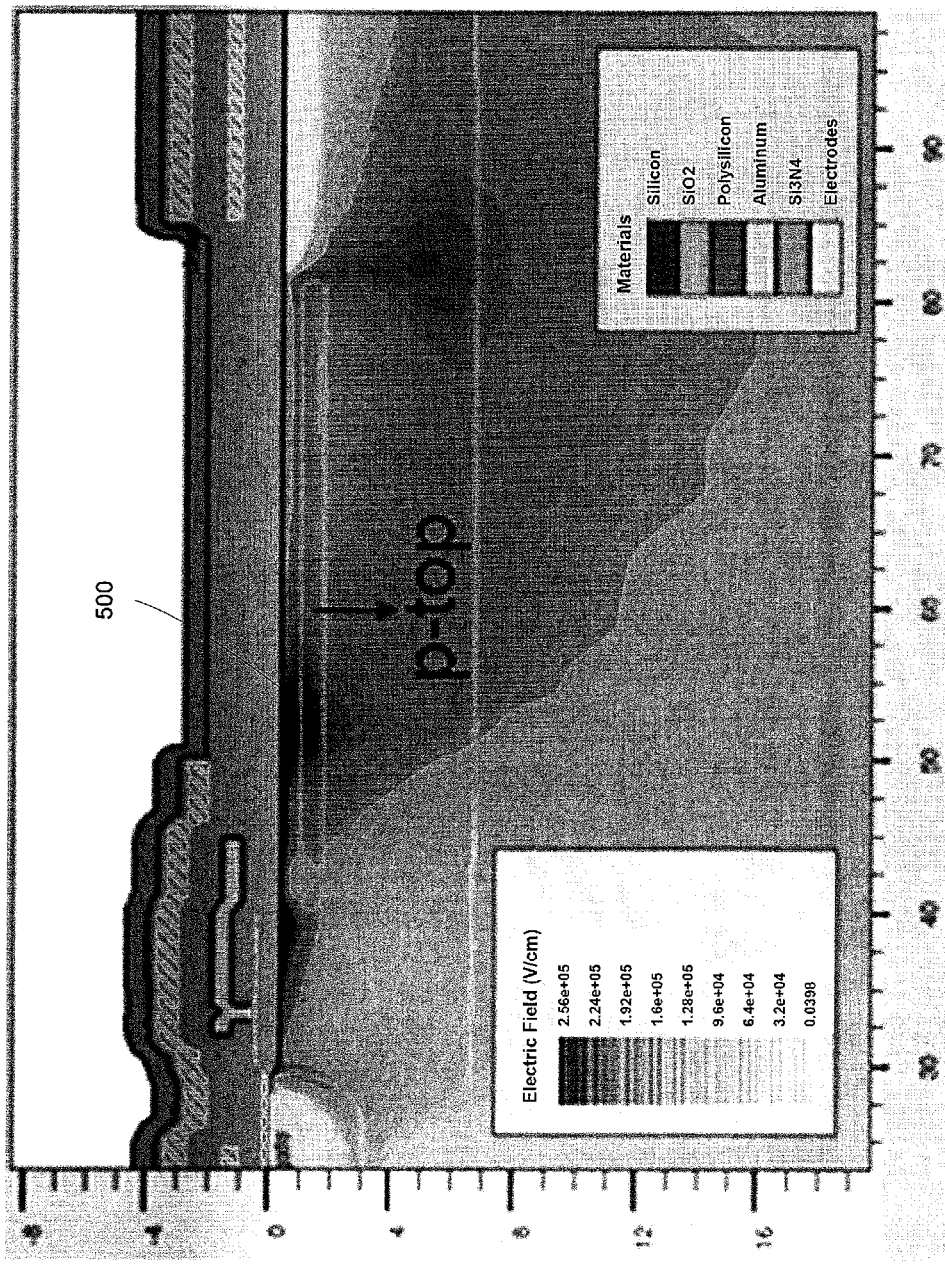
Figure 23A:
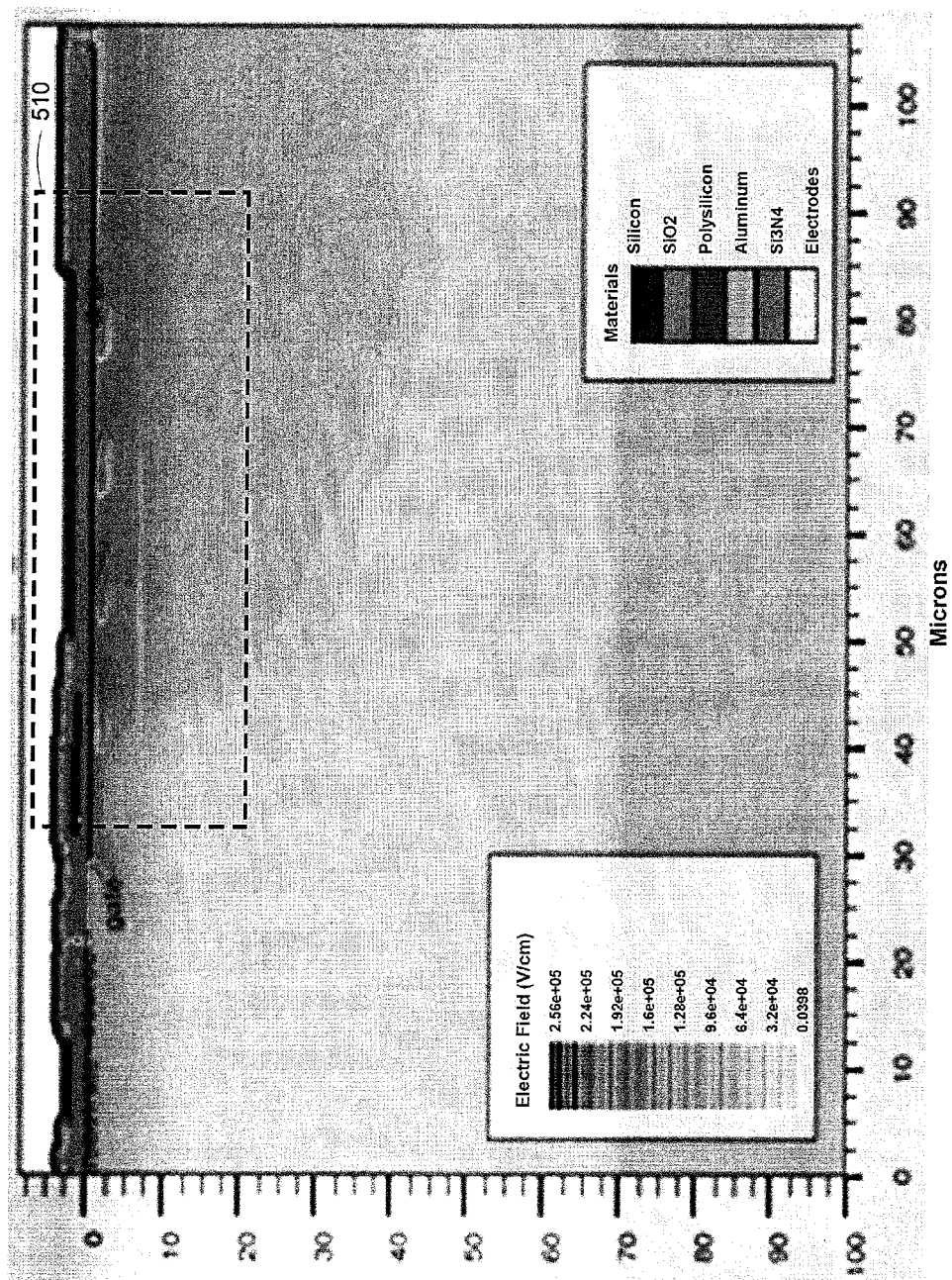
FIGS. 23A and 23B are graphical representations of a TCAD simulation showing the electric field at breakdown for a LDMOS device according to an embodiment of the invention.
Figure 23B:
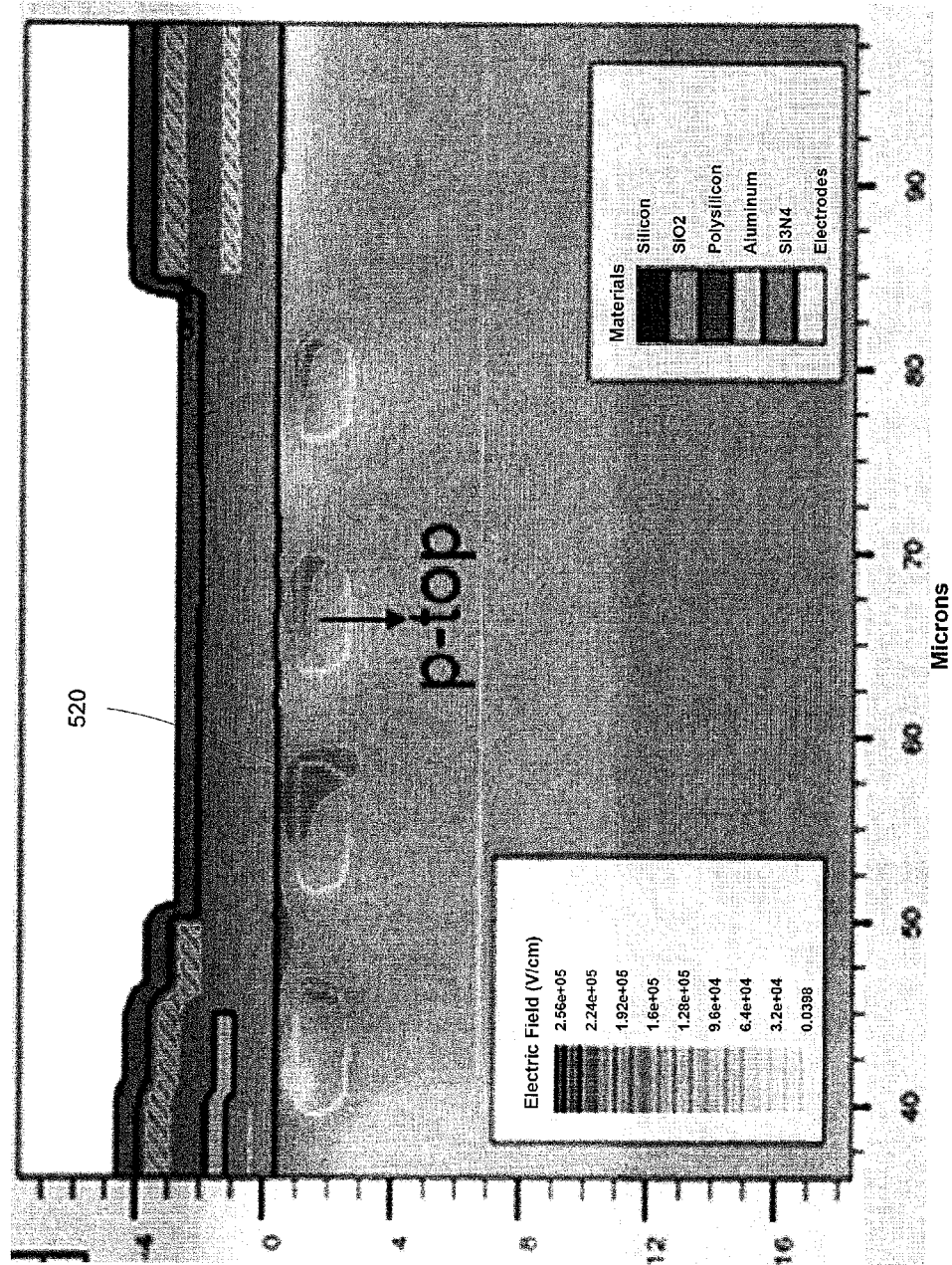

FIG. 22A is a graphical representation of a TCAD simulation showing the electric field at breakdown for a conventional LDMOS device. FIG. 22B is a more detailed representation of the portion 490 identified in FIG. 22A. FIG. 22B shows the point 500 where the electric field is greatest in the device at breakdown. FIG. 23A is a graphical representation of a TCAD simulation showing the potential at breakdown for an exemplary LDMOS device of the invention. FIG. 23B is a more detailed representation of the portion 510 identified in FIG. 23A. FIG. 23B shows the point 520 where the electric field is greatest in the device at breakdown. FIGS. 22A-23B illustrate that the electric field at breakdown is not materially different between a conventional LDMOS device and an LDMOS device of the invention. Thus, the LDMOS device of the invention demonstrates a potential profile at breakdown that is similar to that of a conventional device and the maximum breakdown voltage is not materially affected.

Figure 24A:
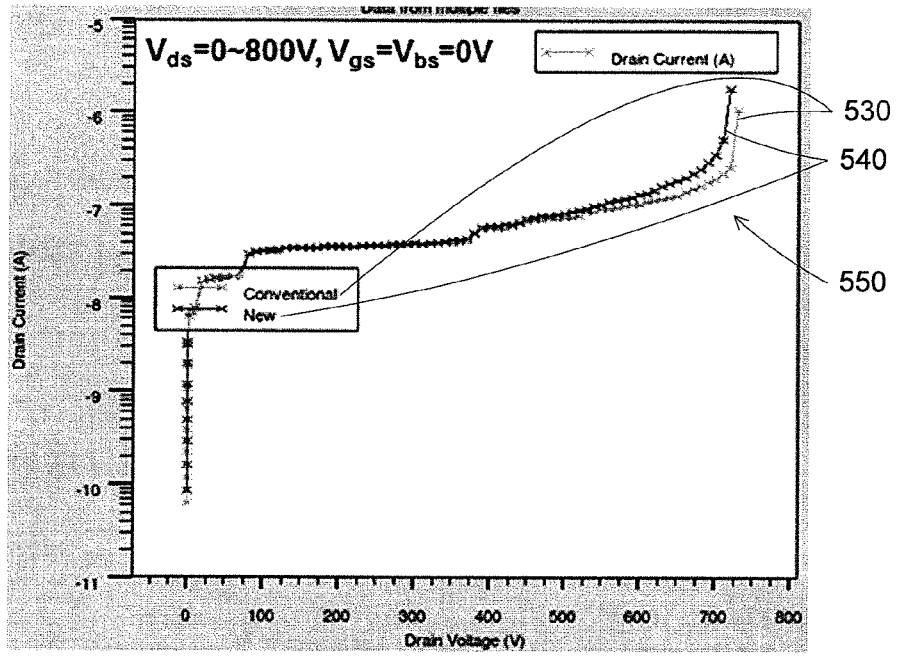
FIG. 24A is a graphical representation of the drain voltage versus the drain current for a conventional LDMOS device and an exemplary LDMOS device according to an embodiment of the invention.
Figure 24B:
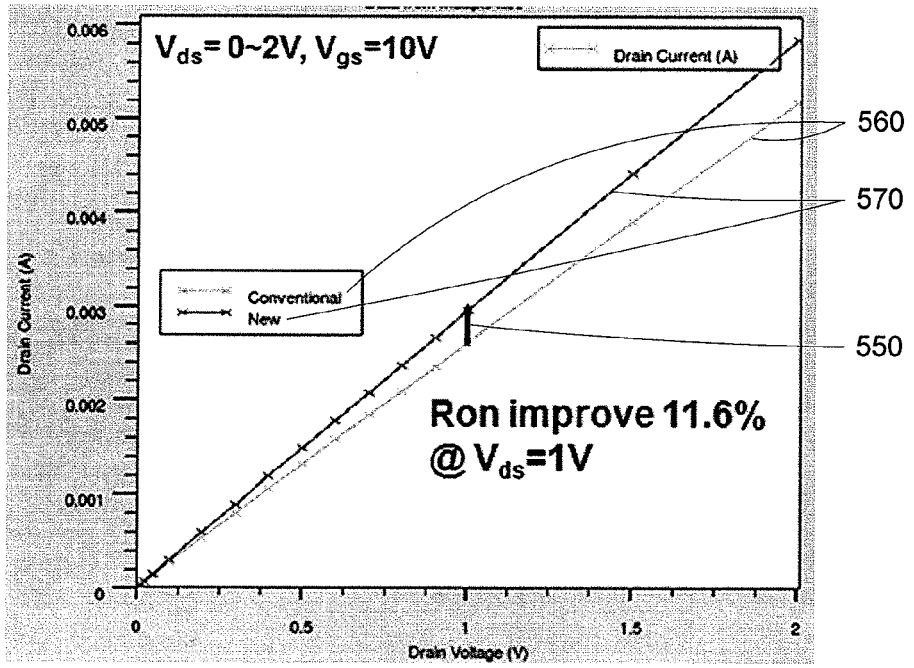
FIG. 24B is another graphical representation of the drain voltage versus the drain current for a conventional LDMOS device and an exemplary LDMOS device according to an embodiment of the invention.

FIG. 24A is a graphical representation of the drain voltage versus the drain current for a conventional LDMOS device 530 and the drain current for an exemplary LDMOS device 540 of the invention. FIG. 24A illustrates that the maximum breakdown voltage 550 is about the same between the conventional LDMOS device and the LDMOS device of the invention. However, the increase in drain current for the LDMOS device of the invention versus the drain current of the conventional device at high drain voltages may be because the inventive device has less resistance at voltages approaching the breakdown voltage FIG. 24B is another graphical representation of the drain voltage versus the drain current for a conventional LDMOS device 560 and the drain current for an exemplary LDMOS device 570 of the invention. FIG. 24B illustrates the exemplary LDMOS device of the invention provides an 11.6% improvement in the on-resistance 580 at a drain voltage of 1 volt over the on-resistance of the conventional LDMOS device having a continuous p-top region.

Figure 25:
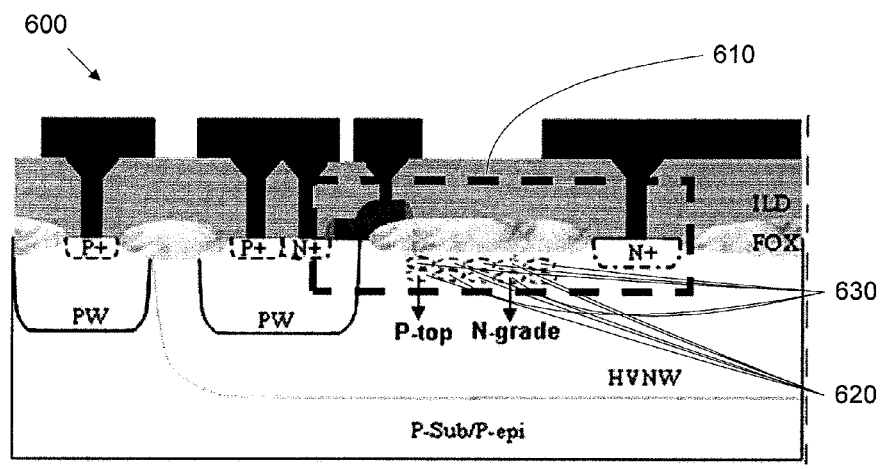
FIG. 25 is a cross-sectional view of a LDMOS device according to an embodiment of the invention.

FIG. 25 illustrates a cross-sectional view of the LDMOS device 600 according to an embodiment of the invention as fully illustration in FIG. 5A. A callout section 610 of the LDMOS device 600 shows a plurality of discrete p-top segments 620 and a plurality of discrete n-grade segments 630 according to an embodiment of the invention.

Figure 26:
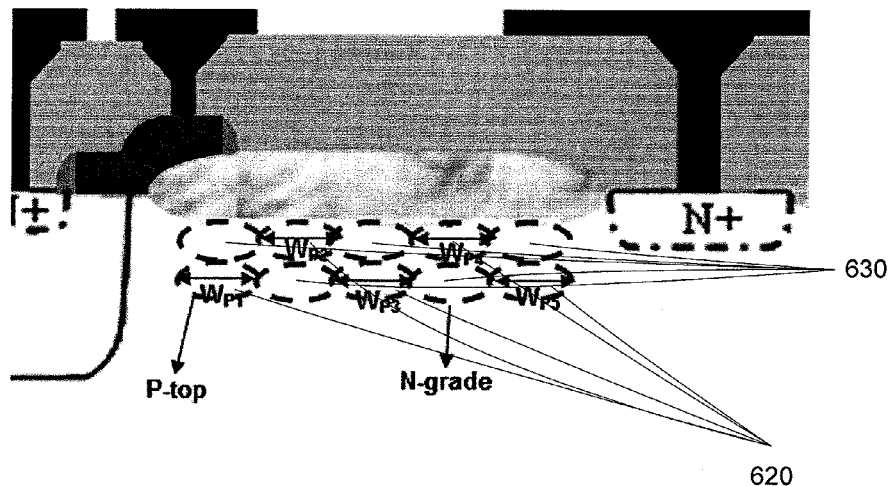
FIG. 26 illustrates a cross-sectional view of the cutout portion of the LDMOS device of FIG. 25 showing varying widths of the discrete elements of the first discrete p-top region and the second discrete p-top region according to an embodiment of the invention.

FIG. 26 illustrates a detail view of the cross-section of section 610 of the exemplary LDMOS device 600 of FIG. 25 showing five discrete p-top segments 620 having widths $W_{P1}$, $W_{P2}$, $W_{P3}$, $W_{P4}$, and $W_{P5}$, respectively. As already provided herein, there may be any number of discrete p-top segments 620 in the discrete n-grade and discrete p-top region, but for illustrative purposes FIG. 26 represents an embodiment having five discrete p-top segments 620. More specifically, the illustrative, exemplary embodiment of FIG. 26 shows a discrete n-grade and discrete p-top region having a bottom layer of a first plurality of discrete p-top segments dispersed among a first plurality of discrete n-grade segments and a top layer of a second plurality of discrete n-grade segments dispersed among a second plurality of discrete n-grade segments. In the exemplary embodiment of FIG. 26, the bottom layer is represented by a first bottom segment that is a discrete p-top segment, followed by a second bottom segment that is a discrete n-grade segment, followed by a third bottom segment that is another discrete p-top segment, followed by a fourth bottom segment that is another discrete n-grade segment, and followed by a fifth bottom segment that is yet another discrete p-top segment. In the exemplary embodiment of FIG. 26, the top layer is represented by a first top segment substantially aligned with the first bottom segment that is a discrete n-grade segment, followed by a second top segment substantially aligned with the second bottom segment that is a discrete p-top segment, followed by a third top segment substantially aligned with the third bottom segment that is another discrete n-grade segment, followed by a fourth top segment substantially aligned with the fourth bottom segment that is another discrete p-top segment, and followed by a fifth top segment substantially aligned with the fifth top segment that is yet another discrete n-grade segment. The structure of the top and bottom layers shown in FIG. 26 represents an arrangement, according to an embodiment of the invention, that is otherwise referred to herein as a "criss-cross arrangement" of discrete p-top segments and discrete n-grade segments.

In an embodiment of the invention, the widths $W_{P1}$, $W_{P2}$, $W_{P3}$, $W_{P4}$, and $W_{P5}$ of the discrete p-top segments 620 may be substantially about the same. In certain other embodiments, the widths $W_{P1}$, $W_{P2}$, $W_{P3}$, $W_{P4}$, and $W_{P5}$ of the discrete p-top segments 620 may be varied to achieve a desired reduction in on-resistance without substantially affecting the maximum breakdown voltage. In certain embodiments of the invention, implantation concentration of p-type ions in the discrete p-top segments 620 may be varied to achieve a fully depleted condition even though the widths of the discrete p-top segments 620 are different. In certain embodiments of the invention, simultaneous adjustments in implantation concentration and widths of the discrete p-top segments 620 along with the spacing distances $S_{P1}$, $S_{P2}$, $S_{P3}$, and $S_{P4}$ and the depths $D_{P1}$, $D_{P2}$, $D_{P3}$, $D_4$, and $D_{P5}$, as further described herein, provide an improved on-resistance while still substantially maintaining a high breakdown voltage at the same time.

Figure 27:
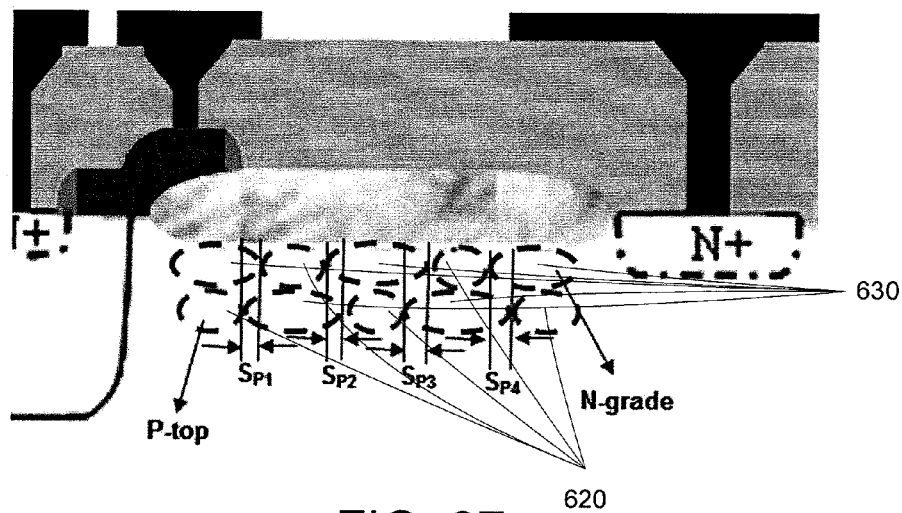
FIG. 27 illustrates a cross-sectional view of the cutout portion of the LDMOS device of FIG. 25 showing varying spacing between the discrete elements of the first discrete p-top region and the second discrete p-top region and the discrete elements of the first discrete n-grade region and the second discrete n-grade region according to an embodiment of the invention.

FIG. 27 illustrates a detail view of the cross-section of section 610 of the exemplary LDMOS device 600 of FIG. 25 showing five discrete p-top segments 620 and five discrete n-grade segments 630 whereby the discrete n-grade segments in an upper portion of the region are disposed above but project over the discrete n-grade segments in a lower portion of the region by spacing distances $S_{P1}$, $S_{P2}$, $S_{P3}$, and $S_{P4}$, respectively. As already provided herein, there may be any number of discrete p-top segments and any number of discrete n-grade segments, but for illustrative purposes FIG. 27 represents an embodiment having five of each. In an embodiment of the invention, the distances $S_{P1}$, $S_{P2}$, $S_{P3}$, and $S_{P4}$ may be substantially about the same. In certain other embodiments of the invention, the distances $S_{P1}$, $S_{P2}$, $S_{P3}$, and $S_{P4}$ may be varied to achieve a desired reduction in on-resistance without substantially affecting the maximum breakdown voltage. In certain embodiments of the invention, implantation concentration of p-type ions in the discrete p-top segments 620 and the implantation concentration of n-type ions in the discrete n-grade segments 630 including the widths of the p-top segments may be varied to achieve a fully depleted condition even though spacing distances $S_{P1}$, $S_{P2}$, $S_{P3}$, and $S_{P4}$ are different. In certain embodiments of the invention, simultaneous adjustments in implantation concentration and widths of the discrete p-top segments 620 and implantation concentration of the discrete n-grade segments 630 in tandem with the spacing distances $S_{P1}$, $S_{P2}$, $S_{P3}$, and $S_{P4}$ provide an improved on-resistance while substantially maintaining a high breakdown voltage at the same time.

Figure 28:
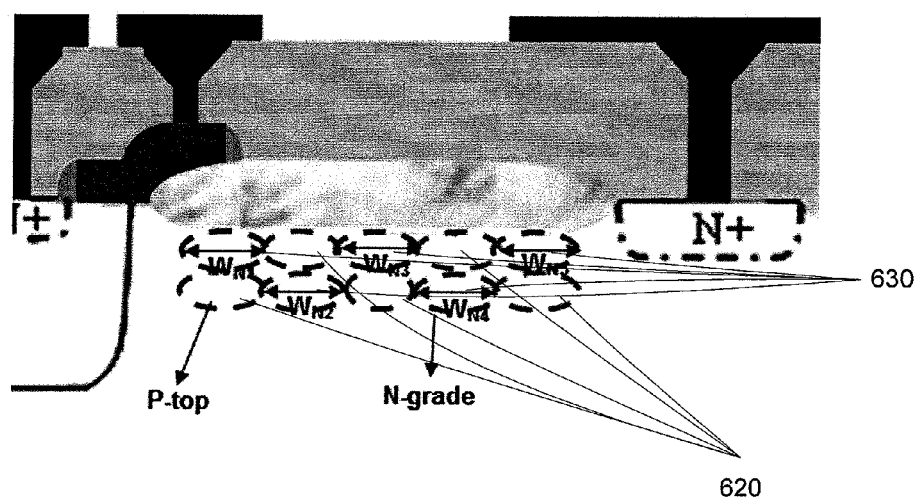
FIG. 28 illustrates a cross-sectional view of the cutout portion of the LDMOS device of FIG. 25 showing varying widths of the discrete elements of the first discrete n-grade region and the second discrete n-grade region according to an embodiment of the invention.

FIG. 28 illustrates a detail view of the cross-section of section 610 of the exemplary LDMOS device 600 of FIG. 25 showing five discrete n-grade segments 630 having widths $W_{N1}$, $W_{N2}$, $W_{N3}$, $W_{N4}$, and $W_{N5}$, respectively. As already provided herein, there may be any number of discrete n-grade segments 630 in the discrete n-grade and discrete p-top region, but for illustrative purposes FIG. 28 represents an embodiment having five discrete n-grade segments 630. In an embodiment of the invention, the widths $W_{N1}$, $W_{N2}$, $W_{N3}$, $W_{N4}$, and $W_{N5}$ of the discrete n-grade segments 630 may be substantially about the same. In certain other embodiments, the widths $W_{N1}$, $W_{N2}$, $W_{N3}$, $W_{N4}$, and $W_{N5}$ of the discrete n-grade segments 630 may be varied to achieve a desired reduction in on-resistance without substantially affecting the maximum breakdown voltage. In certain embodiments of the invention, implantation concentration of n-type ions in the discrete n-grade segments 630 may be varied to achieve a fully depleted condition even though the widths of the discrete n-grade segments 630 are different. In certain embodiments of the invention, simultaneous adjustments in implantation concentration and widths of the discrete n-grade segments 630 along with the spacing distances $S_{N1}$, $S_{N2}$, $S_{N3}$, and $S_{N4}$ and the depths $D_{N1}$, $D_{N2}$, $D_{N3}$, $D_{N4}$, and $D_{N5}$, as further described herein, provide an improved on-resistance while still substantially maintaining a high breakdown voltage at the same time.

Figure 29:
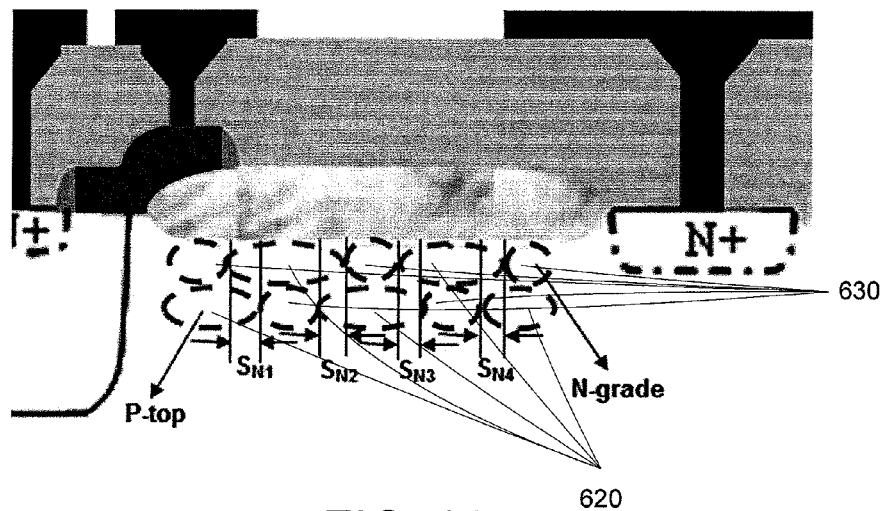
FIG. 29 illustrates a cross-sectional view of the cutout portion of the LDMOS device of FIG. 25 showing varying spacing between the discrete elements of the first discrete n-grade region and the second discrete n-grade region and the discrete elements of the first discrete p-top region and the second discrete p-top region according to an embodiment of the invention.

FIG. 29 illustrates a detail view of the cross-section of section 610 of the exemplary LDMOS device 600 of FIG. 25 showing five discrete p-top segments 620 and five discrete n-grade segments 630 whereby the discrete p-top segments in an upper portion of the region are disposed above but project over the discrete p-top segments in a lower portion of the region by spacing distances $S_{N1}$, $S_{N2}$, $S_{N3}$, and $S_{N4}$, respectively. As already provided herein, there may be any number of discrete n-grade segments and any number of discrete p-top segments, but for illustrative purposes FIG. 29 represents an embodiment having five of each. In an embodiment of the invention, the distances $S_{N1}$, $S_{N2}$, $S_{N3}$, and $S_{N4}$ may be substantially about the same. In certain other embodiments of the invention, the distances $S_{N1}$, $S_{N2}$, $S_{N3}$, and $S_{N4}$ may be varied to achieve a desired reduction in on-resistance without substantially affecting the maximum breakdown voltage. In certain embodiments of the invention, implantation concentration of p-type ions in the discrete p-top segments 620 and the implantation concentration of n-type ions in the discrete n-grade segments 630 including the widths of the n-grade segments may be varied to achieve a fully depleted condition even though spacing distances $S_{N1}$, $S_{N2}$, $S_{N3}$, and $S_{N4}$ are different. In certain embodiments of the invention, simultaneous adjustments in implantation concentration and widths of the discrete n-grade segments 630 and implantation concentration of the discrete p-top segments 620 in tandem with the spacing distances $S_{N1}$, $S_{N2}$, $S_{N3}$, and $S_{N4}$ provide an improved on-resistance while substantially maintaining a high breakdown voltage at the same time.

Figure 30:
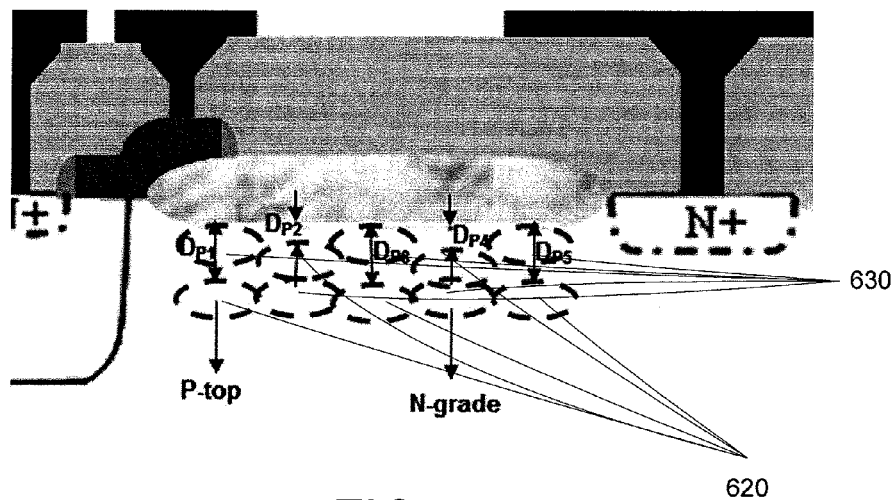
FIG. 30 illustrates a cross-sectional view of the cutout portion of the LDMOS device of FIG. 25 showing varying depths of the discrete elements of the first discrete p-top region and the second discrete p-top region according to an embodiment of the invention.

FIG. 30 illustrates a detail view of the cross-section of section 610 of the exemplary LDMOS device 600 of FIG. 25 showing five discrete p-top segments 620 and five discrete n-grade segments 630 whereby the discrete p-top segments 620 have varying implantations depths $D_{P1}$, $D_{P2}$, $D_{P3}$, $D_{P4}$, and $D_{P5}$, respectively. As already provided herein, varying implantation depths may be controlled by changing conditions of the implantation process, such as, for example, implantation energy. There may be any number of discrete p-top segments and any number of discrete n-grade segments, but for illustrative purposes FIG. 30 represents an embodiment having five of each. In an embodiment of the invention, the depths $D_{P1}$, $D_{P2}$, $D_{P3}$, $D_{P4}$, and $D_{P5}$ may be substantially about the same. In certain other embodiments of the invention, the depths $D_{P1}$, $D_{P2}$, $D_{P3}$, $D_4$, and $D_{P5}$ may be varied to achieve a desired reduction in on-resistance without substantially affecting the maximum breakdown voltage. In certain embodiments of the invention, implantation concentration of p-type ions in the discrete p-top segments 620 and the implantation concentration of n-type ions in the discrete n-grade segments 630 including the widths of the p-top segments and the spacing distances $S_{P1}$, $S_{P2}$, $S_{P3}$, and $S_{P4}$ may be varied to achieve a fully depleted condition even though depths $D_{P1}$, $D_{P2}$, $D_{P3}$, $D_{P4}$, and $D_{P5}$ are different. In certain embodiments of the invention, simultaneous adjustments in implantation concentration, widths of the discrete p-top segments 620, spacing distances $S_{P1}$, $S_{P2}$, $S_{P3}$, and $S_{P4}$, and implantation concentration of the discrete n-grade segments 630 in tandem with the depths $D_{P1}$, $D_{P2}$, $D_{P3}$, $D_{P4}$, and $D_{P5}$ provide an improved on-resistance while substantially maintaining a high breakdown voltage at the same time.

Figure 31:
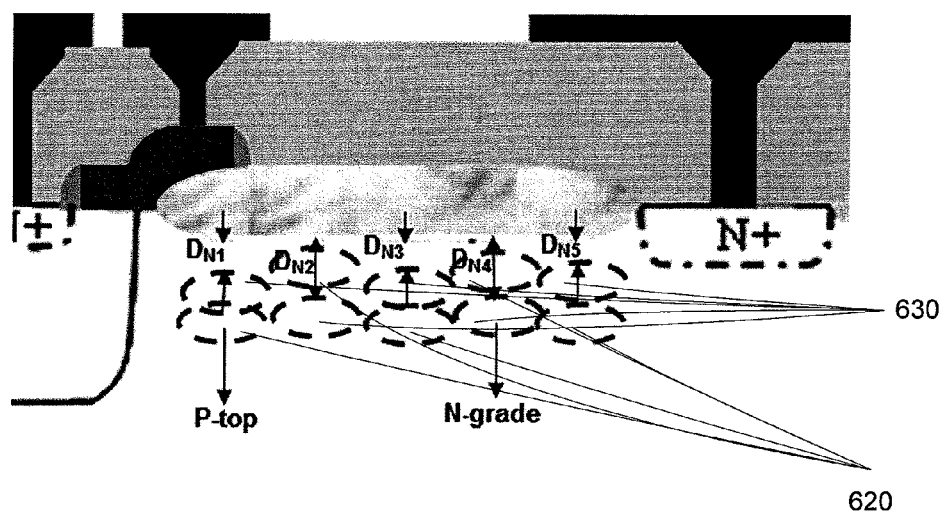
FIG. 31 illustrates a cross-sectional view of the cutout portion of the LDMOS device of FIG. 25 showing varying depths of the discrete elements of the first discrete n-grade region and the second discrete n-grade region according to an embodiment of the invention.

FIG. 31 illustrates a detail view of the cross-section of section 610 of the exemplary LDMOS device 600 of FIG. 25 showing five discrete p-top segments 620 and five discrete n-grade segments 630 whereby the discrete n-grade segments 630 have varying implantations depths $D_{N1}$, $D_{N2}$, $D_{N3}$, $D_{N4}$, and $D_{N5}$, respectively. As already provided herein, varying implantation depths may be controlled by changing conditions of the implantation process, such as, for example, implantation energy. There may be any number of discrete p-top segments and any number of discrete n-grade segments, but for illustrative purposes FIG. 31 represents an embodiment having five of each. In an embodiment of the invention, the depths $D_{N1}$, $D_{N2}$, $D_{N3}$, $D_{N4}$, and $D_{N5}$ may be substantially about the same. In certain other embodiments of the invention, the depths $D_{N1}$, $D_{N2}$, $D_{N3}$, $D_{N4}$, and $D_{N5}$ may be varied to achieve a desired reduction in on-resistance without substantially affecting the maximum breakdown voltage. In certain embodiments of the invention, implantation concentration of n-type ions in the discrete n-grade segments 630 and the implantation concentration of p-type ions in the discrete p-top segments 620 including the widths of the n-grade segments and the spacing distances $S_{N1}$, $S_{N2}$, $S_{N3}$, and $S_{N4}$ may be varied to achieve a fully depleted condition even though depths $D_{N1}$, $D_{N2}$, $D_{N3}$, $D_{N4}$, and $D_{N5}$ are different. In certain embodiments of the invention, simultaneous adjustments in implantation concentration, widths of the discrete n-grade segments 630, spacing distances $S_{N1}$, $S_{N2}$, $S_{N3}$, and $S_{N4}$, and implantation concentration of the discrete p-top segments 620 in tandem with the depths $D_{N1}$, $D_{N2}$, $D_{N3}$, $D_{N4}$, and $D_{N5}$ provide an improved on-resistance while substantially maintaining a high breakdown voltage at the same time.

Indeed any of the variables generally represented as $W_i$, $S_i$, and $D_i$ of a discrete p-top segment$_i$ and an n-grade segment, for any, any combination of, or even all of the discrete p-top segments and discrete n-grade segments of the discrete n-grade and discrete p-top region may be configured to provide at least about 5% improvement, at least about 10% improvement, at least about 15% improvement, at least about 20% improvement, or at least about 25% improvement in the on-resistance compared to a conventional LDMOS device having a substantially continuously disposed p-top region.

Figure 32A:
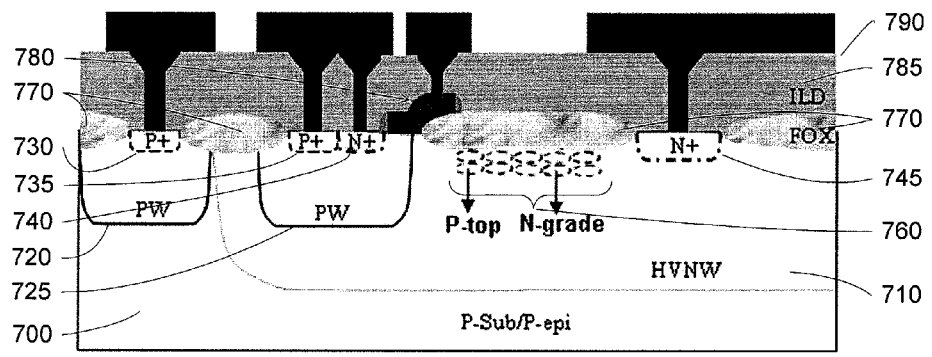
FIG. 32A illustrates a cross-sectional view of an N-channel metal oxide semiconductor device having a plurality of discrete n-grade segments and a plurality of discrete p-top segments according to an embodiment of the invention.

FIG. 32A illustrates a cross-sectional view of an N-channel metal oxide semiconductor (NMOS) device, in particular, an ultra-high voltage NMOS device, having a plurality of discrete n-grade segments and a plurality of discrete p-top segments according to an embodiment of the invention. The exemplary embodiment illustrated in FIG. 32 shows a p-substrate 700, which may be formed in whole or in part as a p-type epitaxial layer, in which an HVNW 710 has been disposed. A first p-well 720 is formed in the p-substrate 700 while a second p-well 725 is formed in the HVNW 710, the first p-well 720 having a first p+ doped region 730 and the second p-well 725 having a second p+ doped region 735 adjacent to an n+ doped source region 740. An n+ doped drain region 745 is formed in the HVNW 710. This section of the NMOS device is represented by a discrete n-grade and discrete p-top region 760 having a plurality of discrete n-grade segments and a plurality of discrete p-top segments (not expressly called out). A field oxide isolation region 770 substantially separates the doped regions 730, 735 & 740, 745. The NMOS also having a control gate structure 780, an interlayer dielectric layer 785 and a conductive layer 790.

Figure 32B:
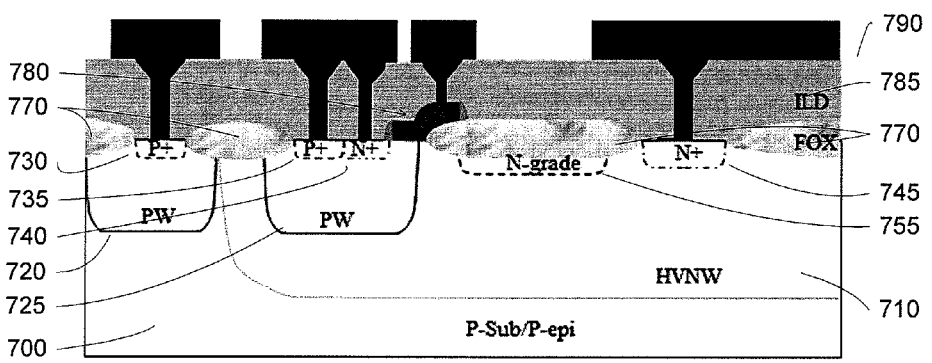
FIG. 32B illustrates a cross-sectional view of an n-grade section of the N-channel metal oxide semiconductor device without the discrete n-grade segments and the discrete p-top segments according to an embodiment of the invention.

FIG. 32B illustrates a cross-sectional view of an n-grade section of the NMOS device without the discrete n-grade segments and the discrete p-top segments of FIG. 32A.

Figure 33A:
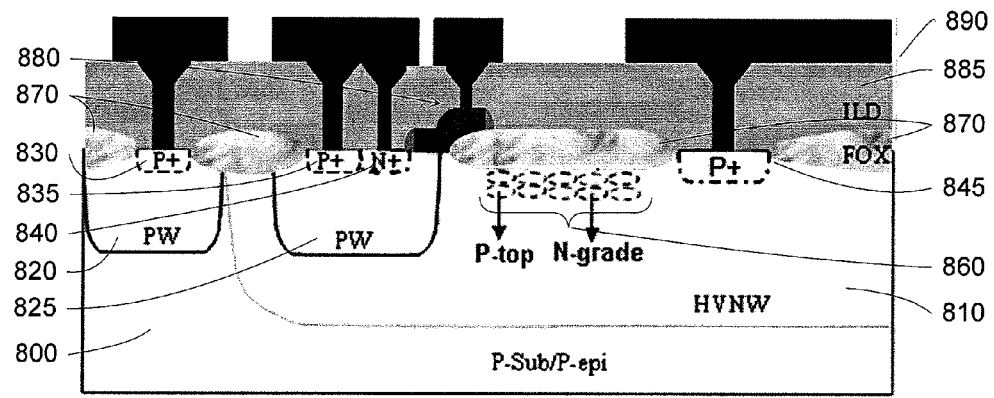
FIG. 33A illustrates a cross-sectional view of an insulated gate bipolar transistor device having a plurality of discrete n-grade segments and a plurality of discrete p-top segments according to an embodiment of the invention.

FIG. 33A illustrates a cross-sectional view of an insulated gate bipolar transistor (IGBT) device, in particular, an ultra-high voltage IGBT device, having a plurality of discrete n-grade segments and a plurality of discrete p-top segments according to an embodiment of the invention. The exemplary embodiment illustrated in FIG. 33A shows a p-substrate 800, which may be formed in whole or in part as a p-type epitaxial layer, in which an HVNW 810 has been disposed. A first p-well 820 is formed in the p-substrate 800 while a second p-well 825 is formed in the HVNW 810, the first p-well 820 having a first p+ doped region 830 and the second p-well 825 having a second p+ doped region 835 adjacent to an n+ doped region 840. A third p+ doped region 845 is formed in the HVNW 810. This section of the NMOS is represented by a discrete n-grade and discrete p-top region 860 having a plurality of discrete n-grade segments and a plurality of discrete p-top segments (not expressly called out). A field oxide isolation region 870 substantially separates the doped regions 830, 835, 840, 845. The IGBT device also having a control gate structure 880, an interlayer dielectric layer 885, and a conductive layer 890.

Figure 33B:
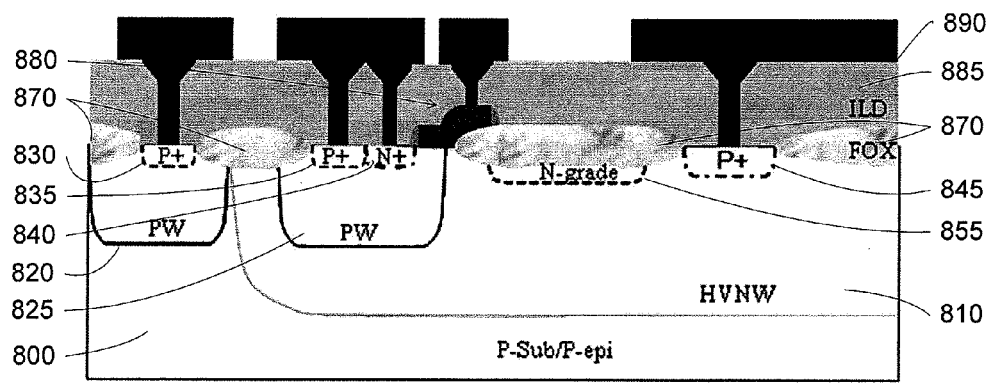
FIG. 33B illustrates a cross-sectional view of an n-grade section of the insulated gate bipolar transistor device without the discrete n-grade segments and the discrete p-top segments according to an embodiment of the invention.

FIG. 33B illustrates a cross-sectional view of an n-grade section of the IGBT device without the discrete n-grade segments and the discrete p-top segments of FIG. 33A.

Figure 34A:
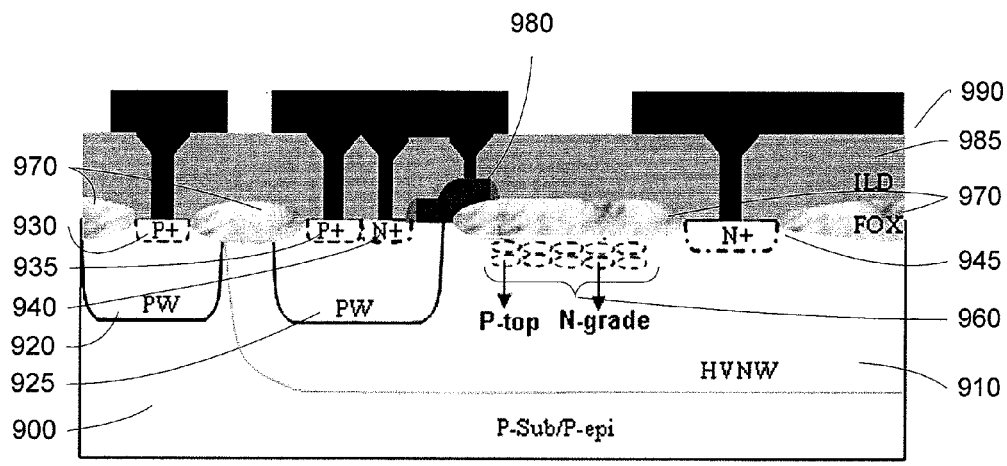
FIG. 34A illustrates a cross-sectional view of a diode having a plurality of discrete n-grade segments and a plurality of discrete p-top segments according to an embodiment of the invention.

FIG. 34A illustrates a cross-sectional view of a diode, in particular, an ultra-high voltage diode, having a plurality of discrete n-grade segments and a plurality of discrete p-top segments according to an embodiment of the invention. The exemplary embodiment illustrated in FIG. 34A shows a p-substrate 900, which may be formed in whole or in part as a p-type epitaxial layer, in which an HVNW 910 has been disposed. A first p-well 920 is formed in the p-substrate 900 while a second p-well 925 is formed in the HVNW 910, the first p-well 920 having a first p+ doped region 930 and the second p-well 925 having a second p+ doped region 935 adjacent to an n+ doped source region 940. An n+ doped drain region 945 is formed in the HVNW 910. This section of the NMOS is represented by a discrete n-grade and discrete p-top region 960 having a plurality of discrete n-grade segments and a plurality of discrete p-top segments (not expressly called out). A field oxide isolation region 970 substantially separates the doped regions 930, 935, 940, 945. The IGBT device also having a control gate structure 980, an interlayer dielectric layer 985, and a conductive layer 990.

Figure 34B:
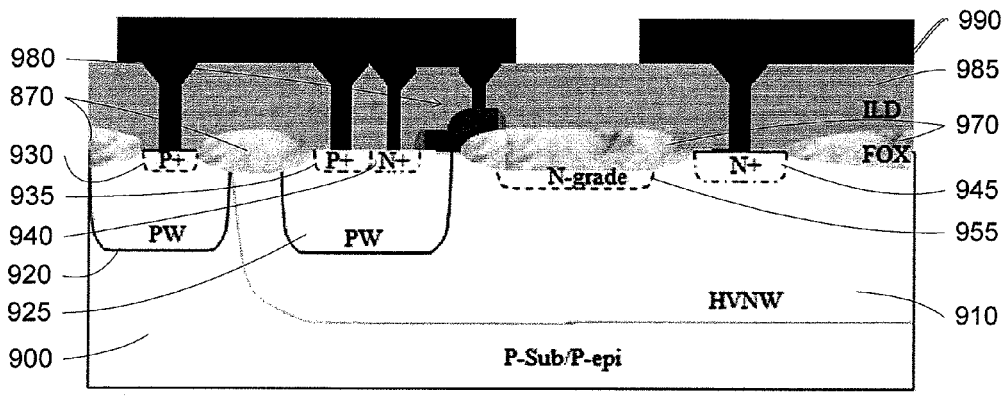
FIG. 34B illustrates a cross-sectional view of an n-grade section of the diode without the discrete n-grade segments and the discrete p-top segments according to an embodiment of the invention.

FIG. 34B illustrates a cross-sectional view of an n-grade section of the diode without the discrete n-grade segments and the discrete p-top segments of FIG. 34A.

Figure 35:
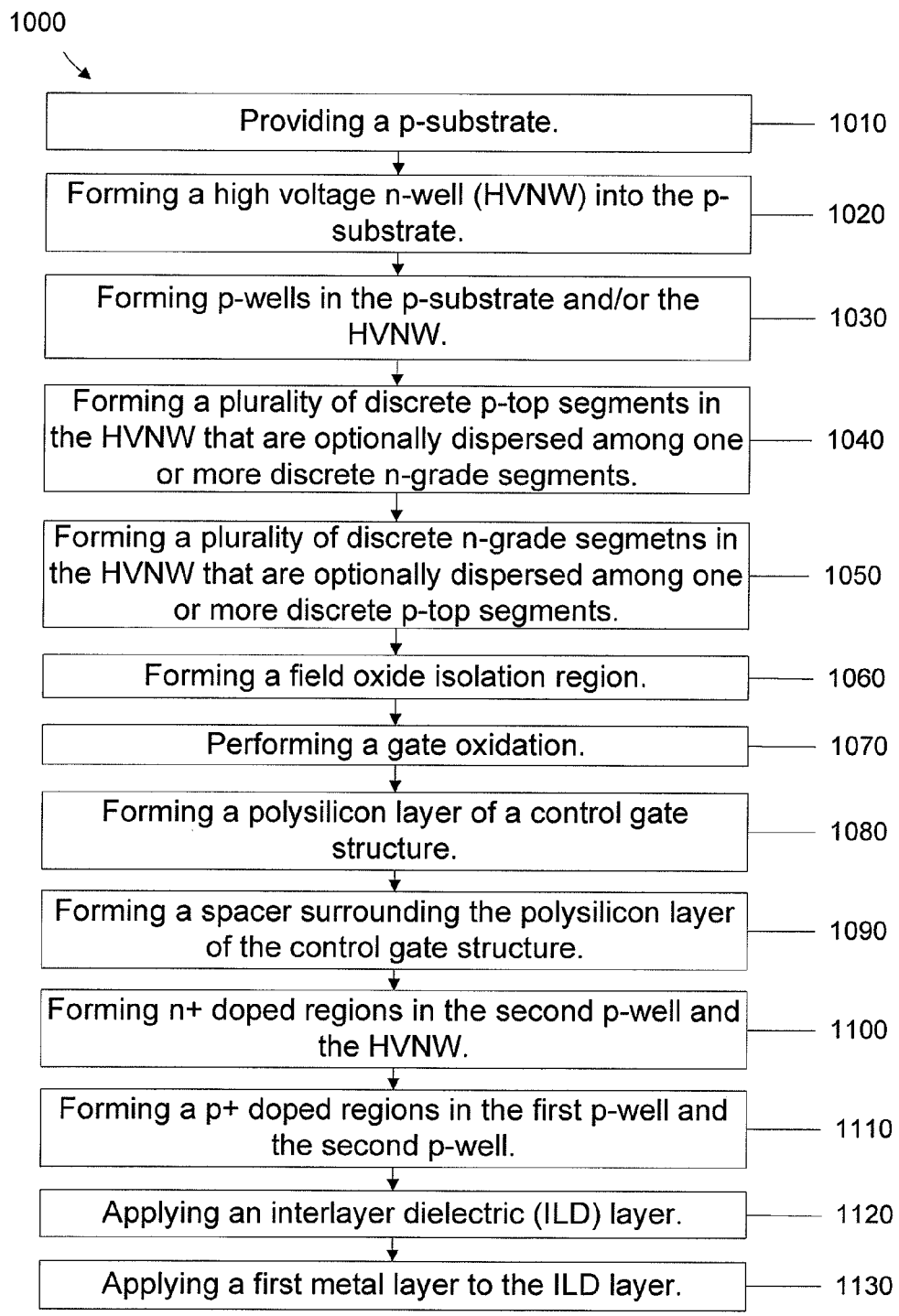
FIG. 35 is a flowchart illustrating a process for fabricating a LDMOS device according to an embodiment of the invention.

FIG. 35 is a flowchart illustrating a process for fabricating a LDMOS device according to an embodiment of the invention. The process for fabricating a LDMOS device 1000 comprises the steps of providing a p-substrate 1010, forming a high voltage n-well into the p-substrate 1020, forming p-wells in the p-substrate and the HVNW 1030, and forming a discrete p-top region in the HVNW 1040, the discrete p-top region comprising a plurality of discrete p-top segments. In an embodiment of the invention, the discrete p-top segments are dispersed among one or more discrete n-grade segments.

The process for fabricating a LDMOS device 1000 may additionally comprise forming a discrete n-grade region in the HVWN 1050, the discrete n-grade region comprising one or more discrete n-grade segments dispersed among one or more discrete p-top segments.

The process for fabricating a LDMOS device 1000 may additionally comprise forming a field oxide isolation region 1070, and forming control gate structure. The step of forming a control gate structure may comprise the steps of performing a gate oxidation 1070, forming a polysilicon layer of the control gate structure 1080, and forming a spacer surrounding the polysilicon layer of the control gate structure 1090.

The process for fabricating a LDMOS device 1000 may additionally comprise the steps of forming n+ doped regions in the second p-well and the HVNW 1100, forming p+ doped regions in the first p-well and the second p-well 1110, applying an interlayer dielectric layer 1120, and applying a first metal layer to the interlayer dielectric layer 1130. The process for fabricating a LDMOS device 1000 may comprise additional steps, for example, such as forming an IMD layer and/or a second metal layer.

An aspect of the invention provides a semiconductor fabricated according to a method of the invention. In certain embodiments of the invention, a MOS device may be fabricated according to certain methods of the invention. In more specific embodiments, a LDMOS may be fabricated according to certain methods of the invention.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method for fabricating a semiconductor comprising:
providing a p-substrate layer;
forming a high voltage n-well (HVNW) into the p-substrate layer;
forming a first p-well in the p-substrate layer;
forming a second p-well in the HVNW; and
forming a discrete n-grade and p-top region in the HVNW, the discrete n-grade and p-top region defined by a plurality of p-top segments dispersed among a plurality of n-grade segments, wherein at least one n-grade segment is located beneath one or more p-top segments.

2. The method of claim 1 additionally comprising forming a field oxide isolation region defined by a first field oxide structure overlapping the first p-well and the second p-well and a second field oxide structure overlapping the n-grade region.

3. The method of claim 2, additionally comprising forming a gate structure.

4. The method of claim 3, wherein forming a gate structure comprises:
performing a gate oxidation;
forming a polysilicon layer; and
forming a spacer to surround the gate structure.

5. The method of claim 3, additionally comprising
forming an n+ doped source region in the second p-well adjacent to the gate structure;
forming a first p+ doped region in the first p-well;
forming a second p+ doped region in the second p-well; and
forming a doped region adjacent to the second field oxide structure in the HVNW.

6. The method of claim 5, wherein the semiconductor is a lateral diffuse metal oxide semiconductor and the doped region is an n+ doped drain region.

7. The method of claim 5, wherein the semiconductor is an insulated gate bipolar transistor and the doped region is a third p+ doped region.

8. The method of claim 1, wherein forming a discrete n-grade and p-top region in the HVNW comprises forming the plurality of p-top segments and the plurality of n-grade segments in a criss-cross arrangement.

9. The method of claim 1, wherein forming a discrete n-grade and p-top region in the HVNW comprises forming each of the plurality of p-top segments having a depth in the HVNW to define a plurality of depths, a width to define a plurality of widths and a separation distance from a vertically adjacent n-grade segment to define a plurality of separation distances.

10. The method of claim 9, wherein each of the depths of the plurality of depths is about the same.

11. The method of claim 9, wherein the depths of the plurality of depths are increasing.

12. The method of claim 9, wherein the plurality of distances, the plurality of widths, and the plurality of separation distances are such that there is at least about a 11.6% reduction in on-resistance at a drain voltage of about 1 volt in comparison to another LDMOS having a continuous p-top region disposed below a continuous n-grade region.

13. The method of claim 9, wherein a breakdown voltage of the LDMOS is about the same as a breakdown voltage of the another LDMOS.

14. The method of claim 1, wherein forming a discrete n-grade and p-top region in the HVNW comprises forming each of the plurality of n-grade segments having a depth in the HVNW to define a plurality of depths, a width to define a plurality of widths and a separation distance from a vertically adjacent p-top segment to define a plurality of separation distances.

15. The method of claim 14, wherein the plurality of distances, the plurality of widths, and the plurality of separation distances are such that there is at least about a 11.6% reduction in on-resistance at a drain voltage of about 1 volt in comparison to another LDMOS having a continuous p-top region disposed below a continuous n-grade region.

16. The method of claim 5, further comprising applying an interlayer dielectric (ILD) layer over the gate structure.

17. The method of claim 16, further comprising applying a first metal layer over the ILD layer.

18. The method of claim 17, further comprising applying an inter-metal dielectric (IMD) layer over the first metal layer.

19. The method of claim 18, further comprising applying a second metal layer over the IMD layer.

20. A method for fabricating a semiconductor comprising:
providing a p-substrate layer;
forming a high voltage n-well (HVNW) into the p-substrate layer;
forming a first p-well in the p-substrate layer;
forming a second p-well in the HVNW; and
forming a discrete n-grade and p-top region in the HVNW, the discrete n-grade and p-top region defined by a plurality of p-top segments and a plurality of n-grade segments,
wherein the discrete n-grade and p-top region comprises a top layer and a bottom layer, wherein the top layer comprises at least one p-top segment and the bottom layer comprises at least one n-grade segment.

* * * * *